(12) United States Patent
Ortiz

(10) Patent No.: US 9,716,447 B2
(45) Date of Patent: Jul. 25, 2017

(54) METHOD AND INTEGRATED MOTOR DRIVE POWER ELECTRONICS SYSTEM WITH IMPROVED EFFICIENCY

(71) Applicant: Raytheon Company, Waltham, MA (US)

(72) Inventor: Joe Anthony Ortiz, Garden Grove, CA (US)

(73) Assignee: Raytheon Company, Waltham, MA (US)

( * ) Notice: Subject to any disclaimer, the term of this patent is extended or adjusted under 35 U.S.C. 154(b) by 80 days.

(21) Appl. No.: 14/307,728

(22) Filed: Jun. 18, 2014

(65) Prior Publication Data

US 2015/0372622 A1 Dec. 24, 2015

(51) Int. Cl.
*H02P 27/00* (2006.01)
*H02P 3/14* (2006.01)
(Continued)

(52) U.S. Cl.
CPC ............. *H02P 3/14* (2013.01); *H02M 1/15* (2013.01); *H03H 11/46* (2013.01);
(Continued)

(58) Field of Classification Search
CPC ..................................................... B60L 15/025
(Continued)

(56) References Cited

U.S. PATENT DOCUMENTS 4,839,754 A * 6/1989 Gami ................... G11B 19/06
360/71
5,109,185 A 4/1992 Ball
(Continued)

FOREIGN PATENT DOCUMENTS

DE 102011082730 A1 * 3/2013 .......... H02M 3/1584
DE 102011082730 A1 3/2013
(Continued)

OTHER PUBLICATIONS

"Application Serial No. PCT/US2014/032643, International Preliminary Report on Patentability mailed Oct. 15, 2015", 9 pgs.
(Continued)

*Primary Examiner* — Eduardo Colon Santana
*Assistant Examiner* — Cortez Cook
(74) *Attorney, Agent, or Firm* — Schwegman Lundberg & Woessner, P.A.

(57) ABSTRACT

Embodiments of an integrated motor drive power electronics system are generally described herein. In some embodiments, the integrated motor drive power electronics system includes an active line filter (ALF) configured to control and regulate current drawn from an input power source and to attenuate current ripple fed back to the input power source, an energy storage capacitance coupled to an output of the active line filter, and a bidirectional low voltage power supply (LVPS). In some embodiments, the bidirectional LVPS may provide regulated power to a load and may selectively recycle power back to the input power source and regulate voltage at the load to a predetermined output voltage. In some embodiments, the energy storage capacitance may serve as a local input power source for higher power motor drive electronics and the bidirectional LVPS.

11 Claims, 15 Drawing Sheets

(51) Int. Cl.
  *H03H 11/46* (2006.01)
  *H02M 1/15* (2006.01)
  *H02M 1/00* (2006.01)

(52) U.S. Cl.
  CPC ... *H02M 2001/007* (2013.01); *H02P 2201/07* (2013.01); *H02P 2201/09* (2013.01)

(58) Field of Classification Search
  USPC .................. 700/275; 318/400.3; 323/234
  See application file for complete search history.

(56) References Cited

U.S. PATENT DOCUMENTS

| | | | |
|---|---|---|---|
| 5,428,523 | A | 6/1995 | Mcdonnal |
| 5,726,550 | A | 3/1998 | Inaniwa et al. |
| 7,019,503 | B1 | 3/2006 | Ortiz et al. |
| 7,038,435 | B2 | 5/2006 | Ortiz et al. |
| 7,141,940 | B2 | 11/2006 | Ortiz |
| 9,048,720 | B2 | 6/2015 | Ortiz |
| 2003/0222502 | A1* | 12/2003 | Takahashi ............ B60L 11/005 307/18 |
| 2009/0228147 | A1* | 9/2009 | Lim ..................... F24F 11/006 700/275 |
| 2010/0201294 | A1* | 8/2010 | Yuuki .................. B60L 15/025 318/400.3 |
| 2010/0244788 | A1* | 9/2010 | Chen ................... H02M 3/1584 323/234 |
| 2010/0284673 | A1* | 11/2010 | Aoki ..................... H02P 7/281 388/821 |
| 2012/0049772 | A1 | 3/2012 | Moussaoui et al. |
| 2012/0112702 | A1 | 5/2012 | Steigerwald et al. |
| 2012/0299378 | A1 | 11/2012 | King et al. |
| 2013/0093241 | A1 | 4/2013 | Lewis |
| 2013/0119903 | A1* | 5/2013 | Weiss ..................... H02H 9/001 318/400.3 |
| 2013/0328539 | A1* | 12/2013 | King ....................... H02J 1/102 323/299 |
| 2014/0292236 | A1 | 10/2014 | Ortiz |

FOREIGN PATENT DOCUMENTS

| | | | |
|---|---|---|---|
| DK | DE102011082730 | * | 3/2013 |
| JP | 06137789 A | | 5/1994 |
| WO | WO-2014/204551 A2 | | 12/2014 |
| WO | WO-2014204551 A3 | | 12/2014 |
| WO | WO-2015195635 A1 | | 12/2015 |

OTHER PUBLICATIONS

"International Application Serial No. PCT/US2015/035987, International Search Report mailed Sep. 29, 2015", 4 pgs.

"International Application Serial No. PCT/US2015/035987, Written Opinion mailed Sep. 29, 2015", 9 pgs.

"U.S. Appl. No. 13/855,298, Notice of Allowance mailed Jan. 23, 2015", 11 pgs.

Dalal, Dhaval, "A Unique Four Quadrant Flybank Converter", [online]. © 2001 Texas Instruments Incorporated. [archived on Feb. 15, 2012]. Retrieved from the Internet: <URL: https://web.archive.org/web/20120215000000*/http://www.ti.com/lit/ml/slup116/slup116.pdf>, (2001), 5-1-5-15.

"International Application Serial No. PCT/US2014/032643, International Search Report mailed Mar. 19, 2015", 3 pgs.

"International Application Serial No. PCT/US2014/032643, Written Opinion mailed Mar. 19, 2015", 7 pgs.

"Japanese Application Serial No. 2016-505621, Office Action mailed Sep. 13, 2016", 7 pgs.

"Japanese Application Serial No. 2016-505621, Response filed Nov. 9, 2016 to Office Action mailed Sep. 13, 2016", 9 pgs.

* cited by examiner

METHOD AND INTEGRATED MOTOR DRIVE POWER ELECTRONICS SYSTEM WITH IMPROVED EFFICIENCY

TECHNICAL FIELD

Embodiments pertain to motor drive power electronics. Some embodiments relate to motor drive power electronics for electronic systems. Some embodiments relate to motor drive power electronics for cryocoolers.

BACKGROUND

Electronics systems, such as communication systems, radar systems, infrared-sensor systems, laser-tracking systems, or directed-energy systems, whether ground-based, mobile, airborne, shipboard, or spacecraft based, generally have several subsystems that receive power from a power source over an electric power buss. Certain subsystems may draw a ripple current from the power source that may affect the other subsystems. For example, in the case of certain types of sensor systems, a cryogenic cooler drive electronics system may draw 10 amps or more of ripple current at a nominal frequency between 35 and 100 Hz from the electric power buss. However, large ripple current draw may destabilize the buss and may degrade the performance of other electronics subsystems using the buss, particularly those managing low power sensor signals. Hence, the imposition of regulations with limitations for conducted emissions EMI such as MIL-STD-461.

Passive filters with large capacitors and inductors have been used to reduce the current ripple on an electric power buss. However, the size and weight of these large capacitors and inductors used for low frequency filter bandwidth make these approaches undesirable for applications where size and/or weight are factors that are considered. Shunt regulators in parallel with the load have also been used. These shunt regulators draw load current under light load conditions and reduce shunt power under system heavy load conditions, keeping the net current drawn from a power source somewhat constant. Although this approach may work well for relatively light fluctuating loads, it wastes power. At high power or for a large quantity of shunt regulators, the power dissipation of the shunt loads may become excessive, increasing net total power draw and reducing the efficiency of the power system. AC-coupled shunt regulators are also used, but they also suffer from excessive power dissipation, and because they are AC coupled, they suffer from bandwidth limitations.

In addition, motors can act as power sources in some operating conditions during some part of their operating cycle. Therefore, motor driver electronics may sink power from the motor as well as source power to the motor. For example, regenerative braking as used in some electric vehicles uses the drive motors as generators to provide regenerative braking. The amount of braking is proportional to the power drawn from the motor. For maximum efficiency, the power drawn from the motor to provide braking is recycled back to the vehicle battery.

Another example includes the above-mentioned cryogenic coolers. For some cryogenic coolers, the motors provide position control braking or temperature control by acting as a power source, absorbing energy from the fluid, and delivering electrical power, during some part of the operating cycle. The motor drive electronics of a cryogenic cooler system therefore not only sources power to the motor, but also sinks power from the motor.

Thus, in cryogenic cooler systems there is bidirectional power flow to and from the motors, and the motor drive electronics provides energy to the motors and receives energy from the motors during some part of the operating cycle. Historically, in cryogenic cooler systems, power sourced from some cryocooler motors has been simply dissipated in a resistor or other load and converted to heat. As a result, the electrical energy is not stored or converted to any other type of work and is therefore wasted. A small converter has been used in cryogenic cooler drive electronics to sink power from a motor and return power back to the source, for a motor that always sourced power. However, the use of a small converter for sinking power from a motor is only useful in cryogenic cooler systems in which a motor is always sourcing power.

Thus, there are needs to drive electric motors, and prevent ripple current from reflecting back to the electric power buss, i.e., there are general needs for systems and methods that efficiently control and regulate input current drawn from an electric power buss to reduce ripple current fed back to the electric power buss. In addition, there are needs to efficiently recycle motor power back to the input power source during those times when the motor is sourcing power. Also, there are needs for an efficient motor drive power system that provides both of these functions.

SUMMARY

An apparatus and method is provided for an efficient motor drive power system that may drive one or more electric motors, and that controls and regulates input current drawn from an electric power buss, such that load current fluctuations and ripple are not reflected back to that electric power buss. In addition, the motor drive power system efficiency recycles motor power back to the input power source during those times when the motor is, or motors are, sourcing power, thus improving power system efficiency, and reducing wasted heat.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In accordance with embodiments, a motor drive power electronics system provides power to one or more motors, and recycles power back to the input power source when the motor is, or motors are, sourcing power, such as during the expansion cycle of a thermodynamic process. An active line filter regulates input current drawn from the input power buss to a DC level, and thus attenuates the ripple current fed back to the power source, and may contain additional control circuitry so as to not modulate input current as a function of output voltage ripple.

The following US patents are incorporated herein by reference: U.S. Pat. Nos. 7,038,435, 7,019,503, and 7,141,940 by reference. The following US patent application is incorporated herein by reference: U.S. patent application Ser. No. 13/855,298 filed Apr. 2, 2013.

Herein, embodiments may be explained in the context of providing power to and recycling power from a motor, e.g., cryogenic cooler motors. However, those skilled in the art will recognize that embodiments described herein may also be applicable to other implementations and therefore such examples are not meant to be limiting. Accordingly, other forms and/or representations may be practiced without departing from the scope of the embodiments described herein.

Figure 1:
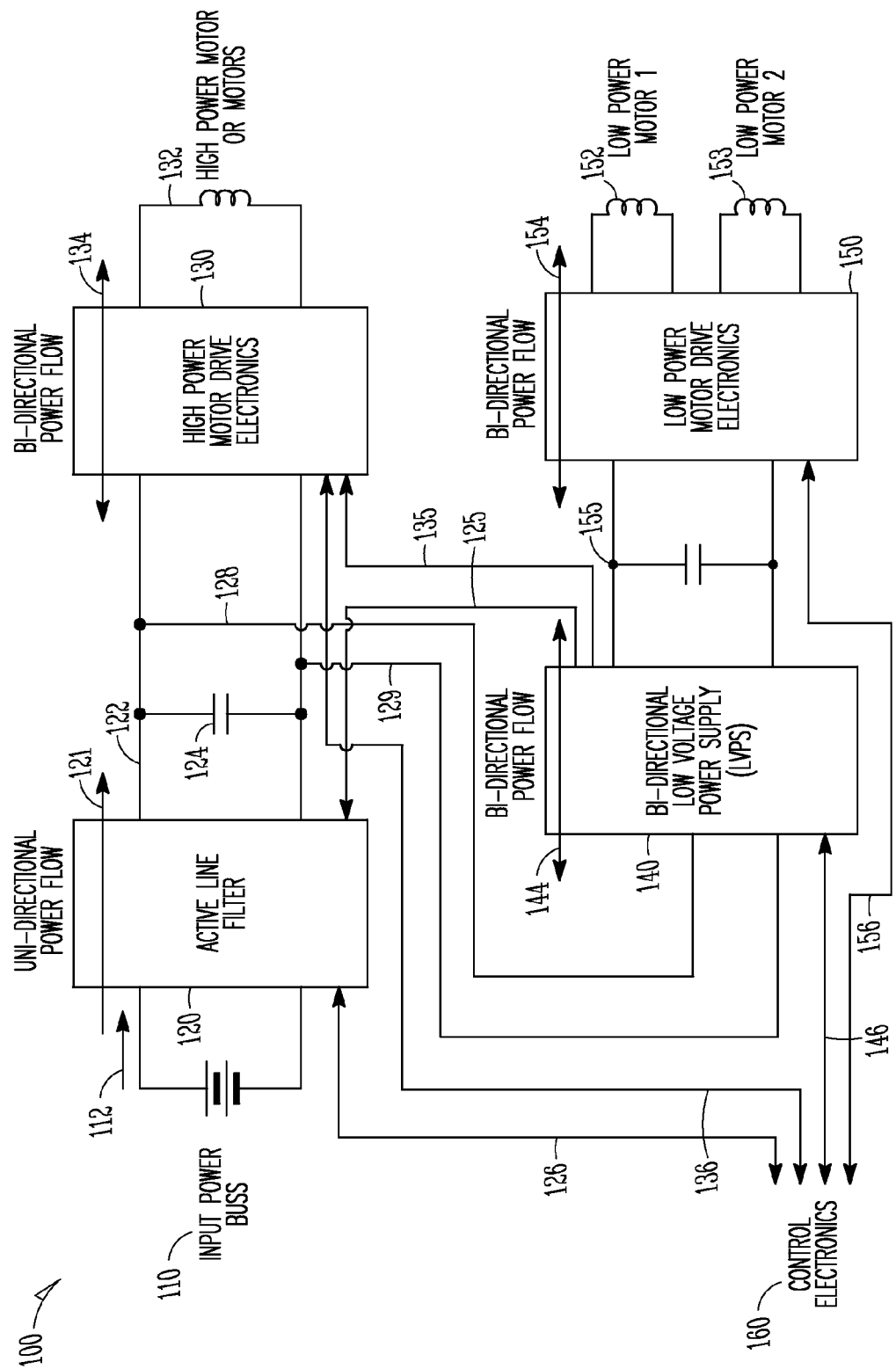
FIG. 1 shows a motor drive power electronics system according to an embodiment.

FIG. 1 illustrates a motor drive power electronics system 100 according to an embodiment. In FIG. 1, an input power buss 110 is coupled to an active line filter 120. The active line filter 120 provides a regulated DC input current 112 drawn from the input power buss 110, and thus reduces ripple current reflected back to the input power buss 110.

The active line filter 120 provides unidirectional power flow 121 from the input power buss 110 to an energy storage capacitance 124, and provides a regulated output voltage 122 across the energy storage capacitance 124.

The energy storage capacitance 124 functions as the local input power source for the high power motor drive electronics 130 and the bidirectional LVPS 140 at the output of the active line filter 120. During the time when the load current drawn by the high power motor drive electronics 130 plus the load current drawn by the bidirectional LVPS 140 is less than the current supplied by the active line filter 120, the energy storage capacitance 124 is recharged by the difference between the current supplied by the active line filter 120 and the load current drawn by the high power motor drive electronics 130 plus the load current drawn by the bidirectional LVPS 140. During the time when the load current drawn by the high power motor drive electronics 130 plus the load current drawn by the bidirectional LVPS 140 is greater than the current supplied by the active line filter 120, the energy storage capacitance 124 provides the difference in current between the load current drawn by the high power motor drive electronics 130 plus the load current drawn by the bidirectional LVPS 140 and the current supplied by the active line filter 120.

According to an embodiment, the active line filter 120 may be a high switching frequency continuous current boost converter with a very low bandwidth control loop. The active line filter 120 may also utilize any of many other switching converter topologies, and provide isolated or non-isolated output power. The active line filter 120 may operate using current mode control to provide a regulated input current 112 drawn from the input power buss 110 with a very slow output voltage regulation loop. The active line filter 120 may utilize peak current mode control with output voltage feedforward, average current mode control, or modified average current mode control so as not to modulate input current 112 as a function of output voltage ripple on the regulated output voltage 122. The active line filter 120 may alternatively operate using voltage mode control or hysteretic current control. The active line filter 120 may also utilize an input voltage feed-forward signal, not shown, and an output load feed-forward signal, not shown, to provide a very fast response to input voltage transients and to output load transients thereby maintaining regulation of the output voltage 122 on the energy storage capacitance 124. By regulating the input current drawn from the input power buss 110 to a DC level, the active line filter 120 provides a DC current draw with significantly attenuated current ripple compared to the load current drawn by the high power motor drive electronics 130 from the energy storage capacitor 124. According to an embodiment, the active line filter 120 may be implemented using a silicon carbide output rectifier to maintain high efficiency at the high switching frequency at significantly reduced size and weight as compared to passive filtering. The active line filter 120 may be controlled by signals from the control electronics 160, or may provide status reporting to the control electronics 160, or both, by means of a configurable interface 126.

High power motor drive electronics 130 is coupled to the energy storage capacitance 124, and provides drive power to one or more high power motors, shown here as motors 132, when the motors are sinking power, and returns power from the high power motors 132 back to the energy storage capacitance 124 when the high power motors 132 are sourcing power. Accordingly, the high power motor drive electronics 130 provides bidirectional power flow 134. The high power motor drive electronics 130 may draw a significant ripple current. The high power motor drive electronics 130 may provide power to the high power motors 132 that is isolated from the energy storage capacitance 124, or that is not isolated from the energy storage capacitance 124. The high power motor drive electronics 130 may be controlled by signals from the control electronics 160, or may provide status reporting to the control electronics 160, or both, by means of a configurable interface 136.

A bidirectional low voltage power supply (LVPS) 140 is coupled to the energy storage capacitance 124, and is powered by the energy stored in the energy storage capacitance 124. The bidirectional LVPS may provide bidirectional power 155 to the low power motor drive electronics 150, may provide bias power 125 to the active line filter 120, may provide bias power 135 to the high power motor drive electronics 130, and may recycle power 155 from the low power motor drive electronics 150 back to the energy storage capacitance 124. Accordingly, the bidirectional LVPS 140 provides bidirectional power flow 144. According to an embodiment, the bidirectional LVPS 140 may use two power converters (not shown in FIG. 1), wherein a first power converter may provide power 155 to the low power drive electronics 150, may provide bias power 125 to the active line filter 120, may provide bias power 135 to the high power motor drive electronics 130, and a second power converter may sink power 155 from the low power drive electronics 150 and return the power to the energy storage capacitance 124. The bidirectional LVPS 140 may provide bidirectional power 155 to the low power motor drive electronics 150, power 125 to the active line filter 120, and power 135 to the high power motor drive electronics 130 that is isolated from the energy storage capacitance 124, or that is not isolated from the energy storage capacitance 124. The bidirectional LVPS 140 may be controlled by signals from the control electronics 160, or may provide status reporting to the control electronics 160, or both, by means of a configurable interface 146.

The bidirectional LVPS 140 may alternatively use more than two power converters (not shown in FIG. 1), wherein a first power converter may provide power 155 to the low power drive electronics 150, a second converter may provide bias power 125 to the active line filter 120, and may provide bias power 135 to the high power motor drive electronics 130, and a third power converter may sink power 155 from the low power drive electronics 150 and return the power to the energy storage capacitance 124, for example. Another converter may be added to provide independent power to the control electronics, for another example. However, two converters will be described herein to illustrate the operation of the bidirectional LVPS.

The low power motor drive electronics 150 is coupled to the bidirectional LVPS 140. The low power motor drive electronics 150 controls operation of one or more low power motors, shown here as motors 152 and 153. The low power motor drive electronics 150 provides drive power to the low power motors 152 and 153, and sinks power from the low power motors 152 and 153 when the low power motors are sourcing power, and returns the power back to the output of the bidirectional LVPS 140. Accordingly, the low power motor drive electronics 150 provides bidirectional power flow 154. The low power motor drive electronics 150 may provide bidirectional power flow 154 that is isolated from the output of the bidirectional LVPS 140, or may provide bidirectional power flow 154 that is not isolated from the output of the bidirectional LVPS 140. The low power motor drive electronics 150 may be controlled by signals from the control electronics 160, or may provide status reporting to the control electronics 160, or both, by means of a configurable interface 156.

Figure 2:
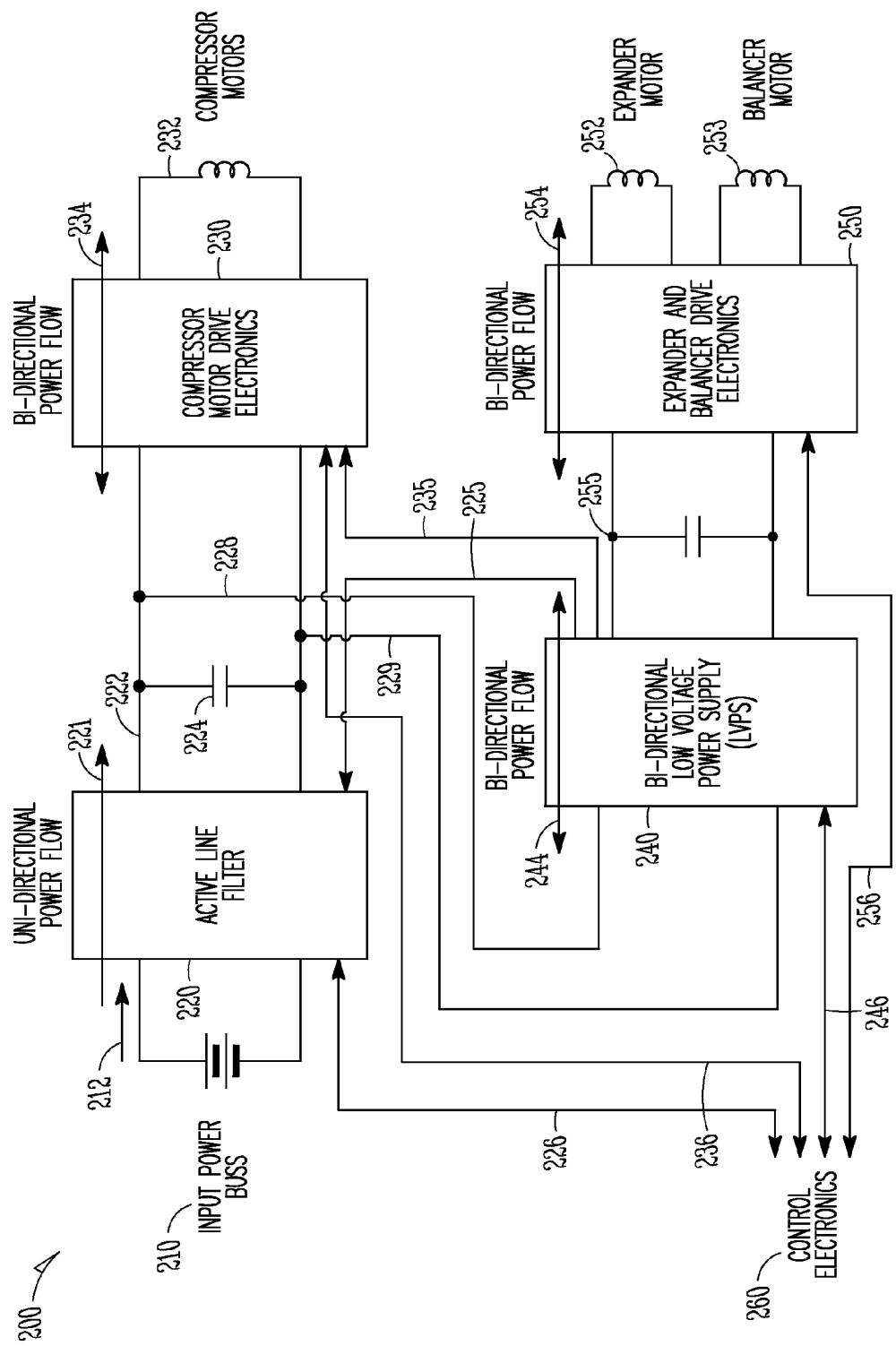
FIG. 2 shows a cryogenic cooler motor drive power electronics system according to an embodiment.

FIG. 2 illustrates a cryogenic cooler motor drive power electronics system 200 according to an embodiment. In FIG. 2, an input power buss 210 is coupled to an active line filter 220. The active line filter 220 provides a regulated input current 212 drawn from the input power buss 210, and thus reduces ripple current reflected back to the input power buss 210. The active line filter 220 provides unidirectional power flow 221 from the input power buss 210 to an energy storage capacitance 224, and provides a regulated output voltage 222 across the energy storage capacitance 224.

The energy storage capacitance 224 functions as the local input power source for the compressor motor drive electronics 230 and the bidirectional LVPS 240 at the output of the active line filter 220. During the time when the load current drawn by the compressor motor drive electronics 230 plus the load current drawn by the bidirectional LVPS 240 is less than the current supplied by the active line filter 220, the energy storage capacitance 224 is recharged by the difference between the current supplied by the active line filter 220 and the load current drawn by the compressor motor drive electronics 230 plus the load current drawn by the bidirectional LVPS 240. During the time when the load current drawn by the compressor motor drive electronics 230 plus the load current drawn by the bidirectional LVPS 240 is greater than the current supplied by the active line filter 220, the energy storage capacitance 224 provides the difference in current between the load current drawn by the compressor motor drive electronics 230 plus the load current drawn by the bidirectional LVPS 240, and the current supplied by the active line filter 220.

According to an embodiment, the active line filter 220 may be a high switching frequency continuous current boost converter with a very low bandwidth control loop. The active line filter 220 may also utilize any of many other switching converter topologies, and provide isolated or non-isolated output power. The active line filter 220 may operate using current mode control to provide a regulated input current 212 drawn from the input power buss 210 with a very slow output voltage regulation loop. The active line filter 220 may utilize peak current mode control with output voltage feedforward, average current mode control, or modified average current mode control so as not to modulate input current 212 as a function of output voltage ripple on the regulated output voltage 222. The active line filter 220 may alternatively operate using voltage mode control or hysteretic current control. The active line filter 220 may also utilize an input voltage feed-forward signal, not shown, and an output load feed-forward signal, not shown, to provide a very fast response to input voltage transients and to output load transients thereby maintaining regulation of the output voltage 222 on the energy storage capacitance 224. By regulating the input current drawn from the input power buss 210 to a DC level, the active line filter 220 provides a DC current draw with significantly attenuated current ripple than the load current drawn by the compressor motor drive electronics 230 from the energy storage capacitor 224. According to an embodiment, the active line filter 220 may be implemented using a silicon carbide output rectifier to maintain high efficiency at the high switching frequency at significantly reduced size and weight as compared to passive filtering. The active line filter 220 may be controlled by signals from the control electronics 260, or may provide status reporting to the control electronics 260, or both, by means of a configurable interface 226.

Compressor motor driver electronics 230 is coupled to the energy storage capacitance 224, and provides drive power to the compressor motors 232 when the motors are sinking power, and returns power from the compressor motors 132 back to the energy storage capacitance 224 when the compressor motors are sourcing power. Accordingly, the compressor motor drive electronics 230 provides bidirectional power flow 234. The compressor motor drive electronics 230 may draw a significant ripple current. The compressor motor drive electronics 230 may provide power to the compressor motors 232 that is isolated from the energy storage capacitance 224, or that is not isolated from the energy storage capacitance 224. The compressor motor drive electronics 230 may be controlled by signals from the control electronics 260, or may provide status reporting to the control electronics 260, or both, by means of a configurable interface 236.

A bidirectional low voltage power supply (LVPS) 240 is coupled to the energy storage capacitance 224, and is powered by the energy stored in the energy storage capacitance 224. The bidirectional LVPS may provide bidirectional power 255 to the expander and balancer motor drive electronics 250, may provide bias power 225 to the active line filter 220, may provide bias power 235 to the compressor motor drive electronics 230, and may recycle power 255 from the expander and balancer motor drive electronics 250 back to energy storage capacitance 224. Accordingly, the bidirectional LVPS 240 provides bidirectional power flow 244. According to an embodiment, the bidirectional LVPS 240 may use two power converters (not shown in FIG. 2), wherein a first power converter may provide power 255 to the expander and balancer drive electronics 250, may provide bias power 225 to the active line filter 220, may provide bias power 235 to the high power motor drive electronics 230, and a second power converter may sink power 255 from the expander and balancer drive electronics 250 and return the power to the energy storage capacitance 224. The bidirectional LVPS 240 may provide power 255 to the expander and balancer motor drive electronics 250, power 225 to the active line filter 220, and power 235 to the compressor motor drive electronics 230 that is isolated from the energy storage capacitance 224, or that is not isolated from the energy storage capacitance 224. The bidirectional LVPS 240 may be controlled by signals from the control electronics 260, or may provide status reporting to the control electronics 260, or both, by means of a configurable interface 246.

The bidirectional LVPS 240 may alternatively use more than two power converters (not shown in FIG. 2), wherein a first power converter may provide power 255 to the low power drive electronics 250, a second converter may provide bias power 225 to the active line filter 220, and may provide bias power 235 to the high power motor drive electronics 230, and a third power converter may sink power 255 from the low power drive electronics 250 and return the power to the energy storage capacitance 224, for example. Another converter may be added to provide independent power to the control electronics, for another example. However, two converters will be described herein to illustrate the operation of the bidirectional LVPS.

The expander and balancer drive electronics 250 is coupled to the bidirectional LVPS 240. The expander and balancer drive electronics 250 controls operation of the expander and balancer motors 252 and 253. The expander and balancer motor drive electronics 250 provides drive power to the expander and balancer motors 252 and 253, and sinks power from the expander and balancer motors 252 and 253 when the motors are sourcing power, and returns the power back to the output of the bidirectional LVPS 240. Accordingly, the expander and balancer motor drive electronics 250 provides bidirectional power flow 254. The expander and balancer motor drive electronics 250 may provide bidirectional power flow 254 that is isolated from the output of the bidirectional LVPS 240, or may provide bidirectional power flow 254 that is not isolated from the output of the bidirectional LVPS 240. The expander and balancer motor drive electronics 250 may be controlled by signals from the control electronics 260, or may provide status reporting to the control electronics 260, or both, by means of a configurable interface 256.

Figure 3:
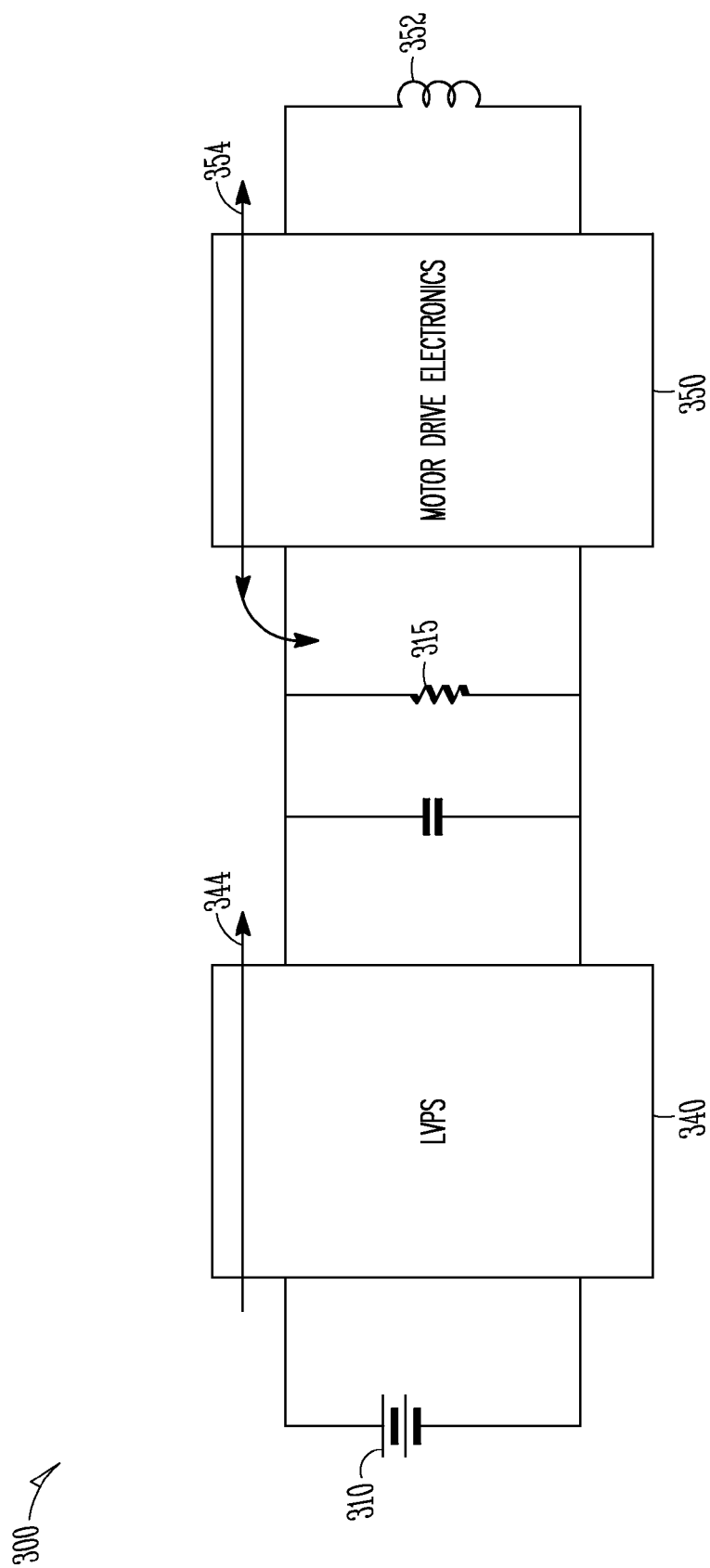
FIG. 3 shows a motor drive system wherein a unidirectional LVPS delivers power to the motor driver and power sourced from the motor is dissipated in a resistive load.

FIG. 3 shows a motor drive system 300 wherein a unidirectional LVPS 340 delivers power to the motor drive electronics 350 and power sourced from the motor is dissipated in a resistive load 315. In FIG. 3, the motor drive electronics 350 is powered through a low voltage power supply (LVPS) 340. An LVPS 340 may be omitted if the motor drive electronics 350 operates straight off the input bus power to drive the motor 352 directly. In FIG. 3, unidirectional input power flow 344 is provided by an input power source 310. A low voltage power supply (LVPS) 340 uses the input power source 310 to provide power to the motor drive electronics 350. The LVPS 340 provides power to the motor drive electronics 350 that is isolated from the input power source 310. Alternatively, the LVPS 340 may provide non-isolated power. The motor drive electronics 350 provides bidirectional power flow 354 for a motor 352 by sinking power from the motor 352 as well as sourcing power to the motor. To maintain regulation, power sourced from the motor 352 is dissipated in a load resistor 315. The resistance of the load resistor 315 is sufficiently low that LVPS 340 always sources power.

For those applications, in which the motor drive electronics 350 operate off secondary power provided by an LVPS 340, a bidirectional LVPS (not shown) may source power and sink power, and recycle the sinked power back to the input power source. By recycling the power back to the input power source, system power dissipation is reduced and overall system efficiency may be improved. In addition, a LVPS bidirectional power converter for recycling power back to the input power may reduce system thermal loading.

Figure 4:
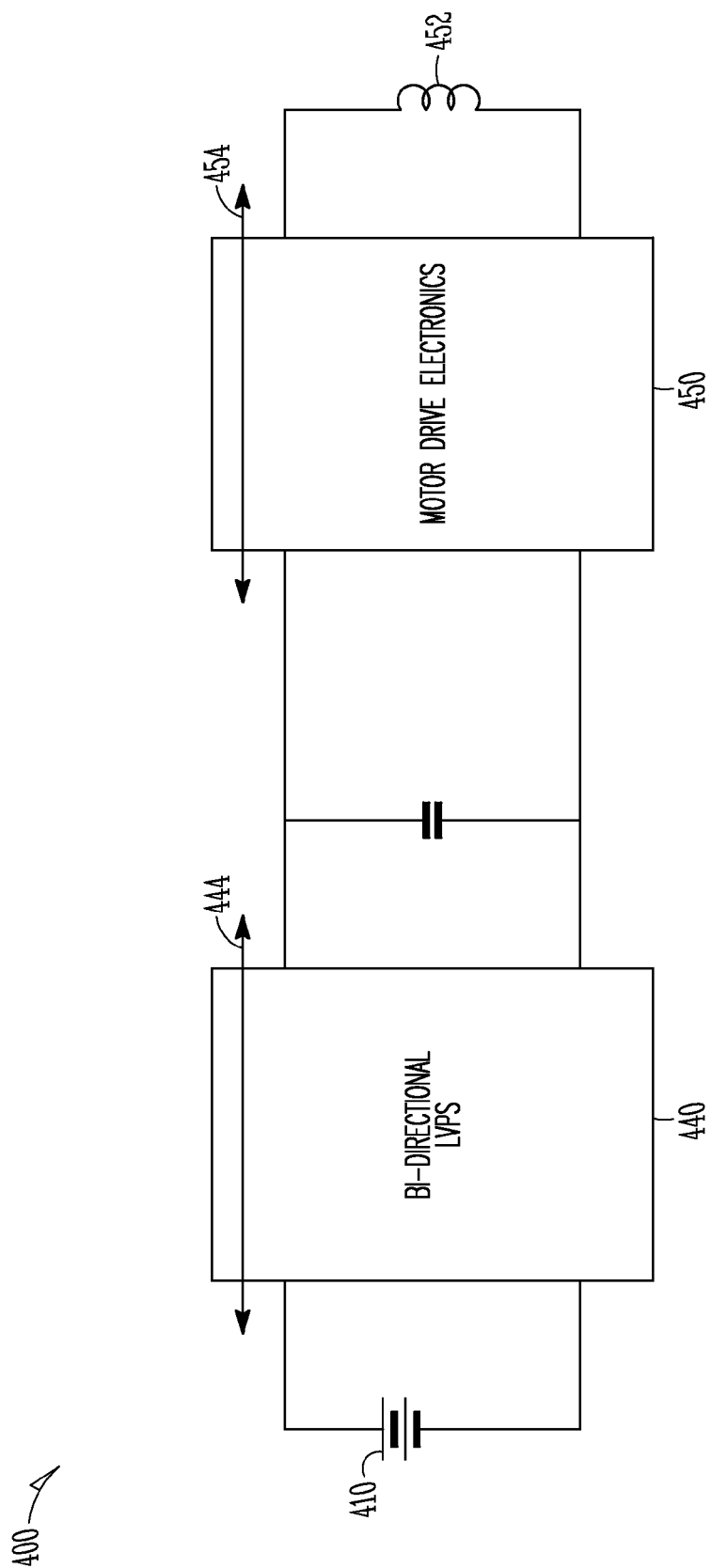
FIG. 4 is a block diagram of a bidirectional LVPS motor drive system according to an embodiment.

FIG. 4 is block diagram of a motor drive system 400 according to an embodiment. In FIG. 4, bidirectional low voltage power supply (LVPS) 440 provides power to the motor drive electronics 450 and recycles power from the motor 452 back to the input power source 410. Accordingly, the bidirectional LVPS 440 provides bidirectional power flow 444. The LVPS 440 may provide power to the motor drive electronics 450 that is isolated from the input power source 410. Alternatively, the LVPS 440 may provide non-isolated power. In the motor drive system 400, a load resistor is not necessary to dissipate power sourced from the motor 452 for maintaining regulation. The power flow through the motor drive electronics 450 is a bidirectional power flow 454.

Figure 5:
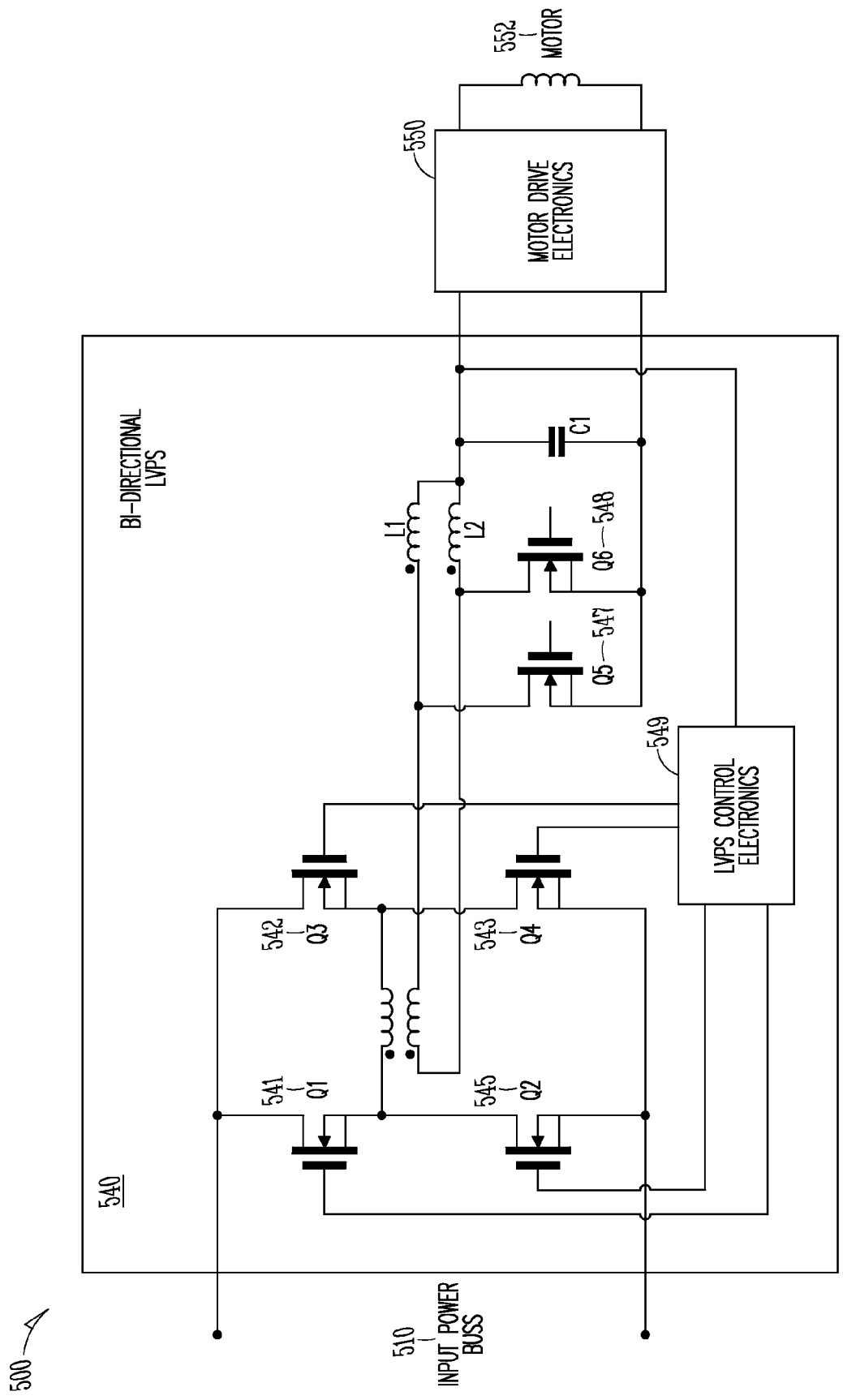
FIG. 5 illustrates an isolated multi-switch bidirectional power converter that uses synchronous rectification to provide low voltage power to the motor drive electronics or sink power from the motor drive electronics and return the power to the source.

FIG. 5 shows a motor drive system 500 wherein an isolated multi-switch bidirectional power converter 540 that uses synchronous rectification provides isolated low voltage power to the motor drive electronics 550 or sinks power from the motor driver electronics 550 and returns the power to the source 510. In FIG. 5, while the input power source 410 is sourcing power, the LVPS 540 operates as a full bridge converter delivering power to the motor drive electronics 550. When the motor 552 is sourcing power, the direction of the output current of the LVPS 540 reverses, and the LVPS 540 begins operating as a current-fed converter transferring power from the LVPS output to the input power source 510. LVPS Control electronics 549 controls operation of the multi-switch bidirectional power converter 540. For example, the operation of transistors Q1 541, Q2 545, Q3 542, Q4 543, Q5 547, and Q6 548 are used to control the sourcing and sinking of power.

Accordingly, the multi-switch bidirectional power converter 540 provides a full-bridge converter using voltage doubler output rectification with synchronous rectifiers. However, the multi-switch bidirectional power converter 540 shown in FIG. 5 includes more parts than for two simple converters, e.g., 6 transistors versus 2 transistors for two simple converters (see FIG. 9 for example), and includes a correspondingly larger board area and volume. There are many other alternative types of power converter topologies that may be used for bidirectional power flow. In one example of an alternative, a bidirectional flyback converter uses three power MOSFETs, three power rectifiers, a four-winding transformer and a pulse width modulation (PWM) controller.

For high power systems, a multi-switch bidirectional power converter 540 using synchronous rectification may be used to source and sink power, and recycle the sinked power back to the input power source 510 to reduce system power dissipation and to improve overall system efficiency. However, for low power systems, the volume, cost, and complexity of a multi-switch bidirectional power converter may not be warranted.

Figure 6:
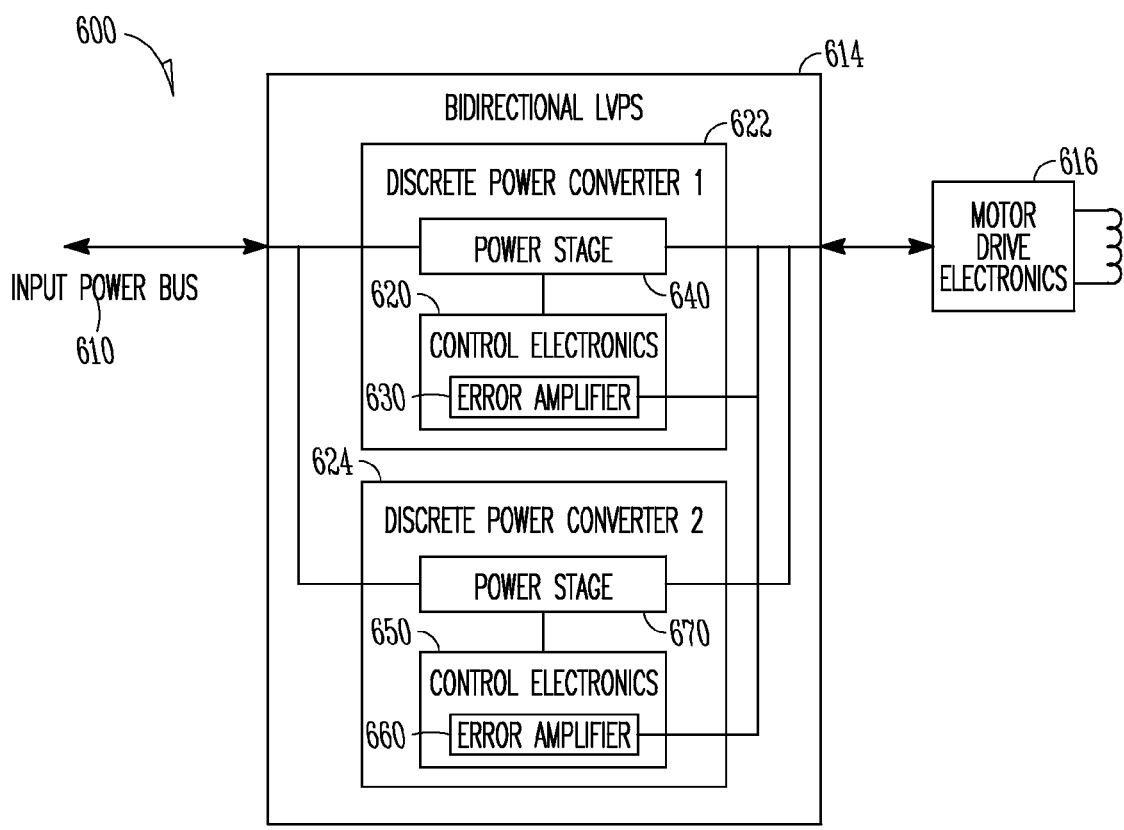
FIG. 6 is a block diagram of a bidirectional low voltage power supply (LVPS) according to an embodiment.

FIG. 6 is a block diagram of a motor drive system 600 that uses a bidirectional LVPS 614, according to an embodiment. In FIG. 6, the LVPS 614 includes two simple, discrete and inexpensive converters 622, 624, set up to regulate the output voltage to the motor drive electronics 616. The LVPS 614 may provide power to the motor drive electronics 616 that is isolated from the input power source 610. Alternatively, the LVPS 614 may provide non-isolated power. The second discrete converter 624 is coupled in parallel to the first discrete converter 622 in an opposite orientation. The first converter 622 delivers power from the input power source 610 to the motor drive electronics 616 and regulates the voltage to the motor drive electronics 616 when the motor is driven as a load. The first power converter 622 thus provides power to the motor drive electronics 616, while the second power converter 624 is off. Subsequently, when the motor is functioning as a power source, the output voltage of the first converter increases, the first converter shuts off, and the second converter 624 sinks power from the motor drive electronics 616, and delivers power to the input power source 610, regulating the voltage to the motor drive electronics 616. Thus, when power is being sourced by the motor, e.g., during a coolant expansion phase, the first power converter 622 turns off and the second power converter turns on to recycle power from the motor drive electronics back to the input power source 610. The first discrete power converter 622 includes a first power stage 640 and first control electronics 620. The first control electronics 620 includes a first error amplifier 630. The second power converter 624 includes a second power stage 670 and second control electronics 650. The second control electronics 650 includes a second error amplifier 660. The error amplifier 660 is biased to regulate the voltage to the motor drive electronics to a slightly higher voltage than that to which the error amplifier 630 is biased to regulate.

The bidirectional LVPS converter 614 is coupled to the input power source 610 to provide power to the motor drive electronics 616. When the motor is acting as a load, the first discrete converter 622 provides power, and regulates the voltage to the motor drive electronics 616 to a predetermined voltage. When the motor functions as a power source, and the motor drive electronics 616 returns power to the output of the first converter 622, the voltage at the output of the first converter 622 increases, the error amplifier 630 shuts off the power stage 640, and the output power of the first discrete converter 622 is decreased to zero until such time as the output voltage drops low. When the voltage at the output of the first converter 622 increases sufficiently, the error amplifier 660 turns on the power stage 670 to sink power from the motor drive electronics 616, and deliver power back to the input power source 610. This reduces the voltage to the motor drive electronics 616.

Conversely, if the voltage to the motor drive electronics 616 decreases excessively, the duty cycle and output power of the second discrete converter 624 is decreased to sink less power from the motor drive electronics 616, and deliver less power to the input power source 610, thus allowing the voltage to the motor drive electronics 616 to increase. If the voltage to the motor drive electronics 616 decreases sufficiently, the duty cycle and output power of the second discrete converter 624 is decreased to zero, until such time as the output voltage rises high.

Those skilled in the art will recognize that the two discrete converters 622, 624 may be isolated flyback converters, isolated forward converters, or one of each, or any other topology, but note that embodiments are not meant to be limited in that respect. The input power source 610 may already be isolated from primary power, in which case the two discrete converters 622, 624 may be non-isolated converters. However, embodiments are not limited in that respect.

Note that the bidirectional LVPS may alternatively use more than two power converters (not shown in FIG. 6). For example, one power converter may provide power to the low power drive electronics, a second converter may provide bias power to the active line filter and to the high power motor drive electronics, and a third power converter may sink power from the low power drive electronics and return the power to the energy storage capacitance. Another converter may be added to provide independent power to the control electronics, for another example. Two power converters are discussed herein, however, it is to be understood that the figures are discussed to illustrate, not limit, and the embodiments are not limited in that respect.

Due to component value initial tolerance, drift, or temperature coefficient, the voltage set point of the second discrete converter 624 may drift to less than the voltage set point of the first discrete converter 622, in which case, the two simple converters would be on at the same time, thereby cycling power in a loop. Such cycling of power would waste power and reduce efficiency. One method to prevent the discrete converters 622, 624 being on at the same time is to use a significantly higher voltage regulation set-point for the second discrete converter 624. Another method is to hold the second discrete converter 624 off while the first discrete converter 622 is operating.

Irrespective of whether the first discrete converter 622 uses voltage mode control or current mode control, the output voltage of the first error amplifier 630 of the first discrete converter 622 drops low to command a lower output voltage during the time when the motor is acting as a power source, and converter 622 output voltage is increasing. Also, the output voltage of the first error amplifier 630 of the first discrete converter 622 rises high to command a higher output voltage during the time when the motor is acting as a load, and converter 622 output voltage is decreasing. Thus, the output voltage of the first error amplifier 630 of the first discrete converter 622 indicates whether more throughput power or output voltage is required, or whether less throughput power or output voltage is required, and thus, the output voltage of the first error amplifier 630 of the first discrete converter 622 may be used to trigger the second discrete converter 624 to turn on or off.

There are several ways to use the output voltage of the first error amplifier 630 of the first discrete converter 622 to enable the second discrete converter 624, or conversely, to disable the second discrete converter 624.

There are also several ways to implement the bidirectional LVPS illustrated in the block diagrams. A few examples of embodiments of a bidirectional LVPS are given here. However, it is to be noted that these few examples are given to be illustrative, and not restrictive.

Figure 7:
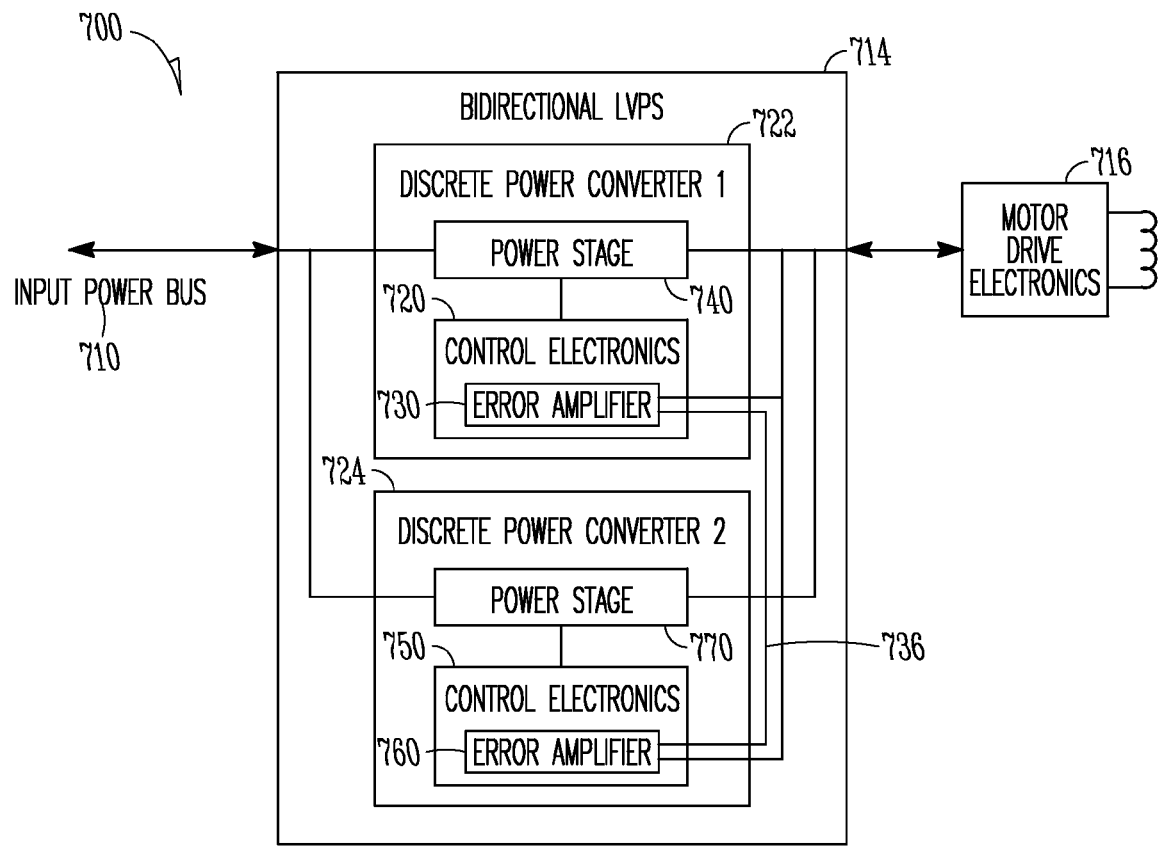
FIG. 7 is a block diagram of a bidirectional low voltage power supply (LVPS) that uses two converters, in which operation of the second converter is controlled by the error amplifier of the first converter, according to an embodiment.

FIG. 7 is a block diagram of a motor drive system 700 that uses a bidirectional low voltage power supply (LVPS) 714 that uses two converters according to another embodiment. The LVPS 714 may provide power to the motor drive electronics 716 that is isolated from the input power source 710. Alternatively, the LVPS 714 may provide non-isolated power. In FIG. 7, the bidirectional low voltage power supply (LVPS) 714 includes a first discrete power converter 722 and a second discrete power converter 724. The first discrete power converter 722 includes a first power stage 740 and first control electronics 720. The first control electronics 720 includes a first error amplifier 730. The second power converter 724 includes a second power stage 770 and second control electronics 750. The second control electronics 750 includes a second error amplifier 760. In FIG. 7, the second converter 724 is controlled by the error amplifier 730 of the first converter 722 by means of a signal 736. The signal 736 may be the direct output of the error amplifier 730, or may be a signal generated from the output of the error amplifier 730.

The bidirectional LVPS converter 714 is coupled to the input power source 710 to provide power to the motor drive electronics 716. When the motor is acting as a load, the first discrete converter 722 provides power, and regulates the voltage to the motor drive electronics 716 to a predetermined voltage at the output of the first discrete converter 722. The error amplifier 730 holds off the second discrete converter 724 by means of signal 736. When the motor functions as a power source, and the motor drive electronics return power to the output of the first converter 722, the voltage at the output of the first converter 722 increases, the error amplifier 730 shuts off the power stage 720, and the output power of the first discrete converter 722 is decreased to zero until such time as the output voltage drops. The error amplifier 730 dropping low enables the second converter 724 by means of signal 736. When the voltage at the output of the first converter 722 increases sufficiently, the error amplifier 760 turns on the power stage 770 of the second discrete converter 724 to sink power from the motor drive electronics 716, and deliver power to the input power source 710. This reduces the voltage to the motor drive electronics 716.

If the voltage to the motor drive electronics 716 increases, the duty cycle (and output power) of the second discrete converter 724 is increased to sink additional power from the motor drive electronics 716, and deliver additional power to the input power source 710. This reduces the voltage to the motor drive electronics 716.

Conversely, if the voltage to the motor drive electronics 716 decreases, the duty cycle and output power of the second discrete converter 724 is decreased to sink less power from the motor drive electronics 716, and deliver less power to the input power source 710, thus regulating the voltage to the motor drive electronics 716.

When the motor again acts as a load, and the motor drive electronics draw power from the output of the first converter 722, the voltage at the output of the first converter 722 decreases. The error amplifier 730 senses the lower voltage, and increases its output voltage, enabling the power stage 740, and the first discrete converter 722 provides power, and regulates the voltage to the motor drive electronics 716 to the predetermined voltage. The error amplifier 730 also holds off the second discrete converter 724 by means of signal 736. Thus, in the bidirectional LVPS 714 of FIG. 7, the output voltage of the error amplifier 730 of the first discrete power converter 722 is used to control the second discrete power converter 724.

Figure 8:
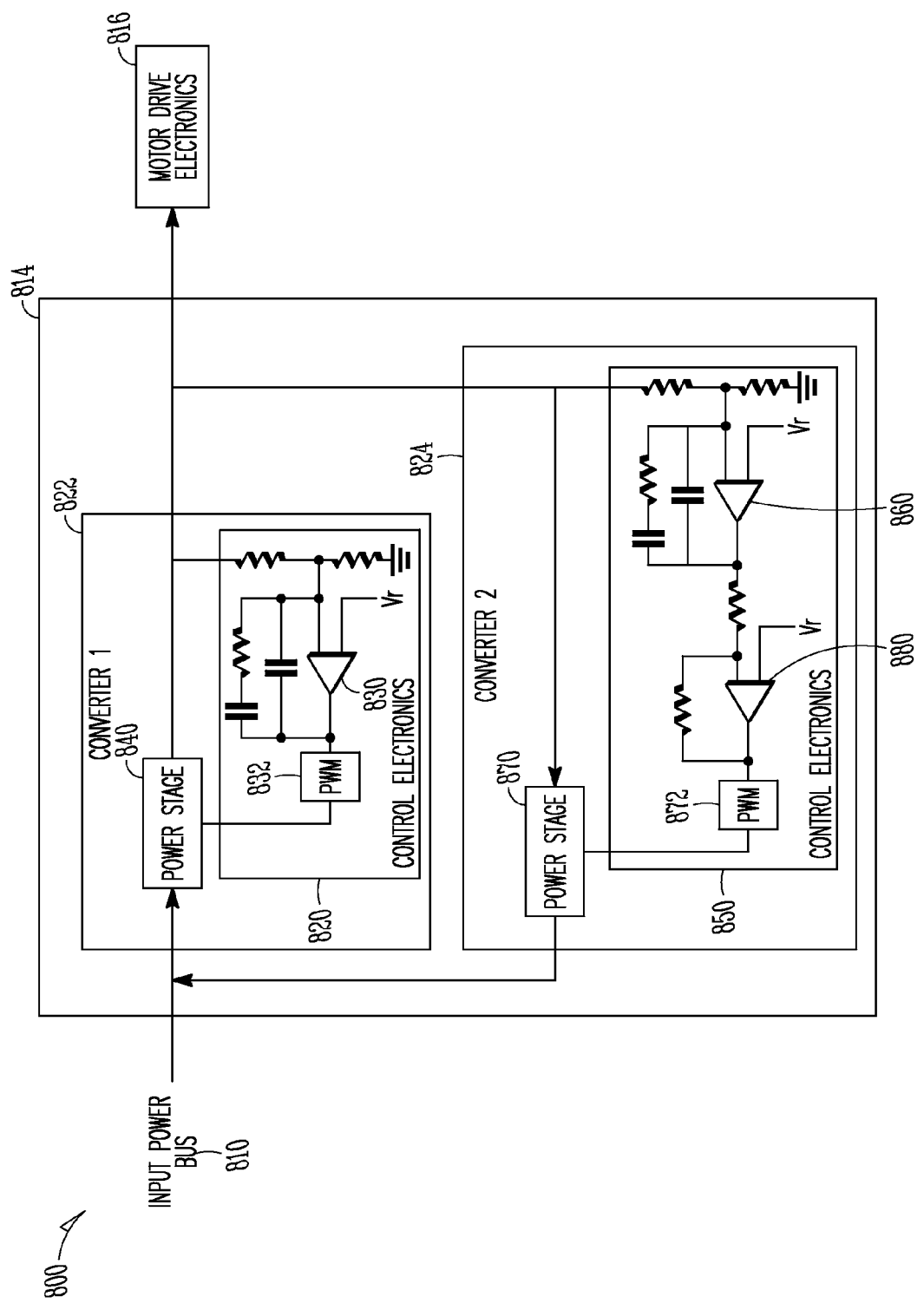
FIG. 8 is a detailed block diagram of a bidirectional low voltage power supply (LVPS) that uses two converters, according to an embodiment.

FIG. 8 is a block diagram of a motor drive system 800 that shows a simplified schematic diagram of a bidirectional low voltage power supply (LVPS) 814 that uses two converters, according to an embodiment. The LVPS 814 may provide power to the motor drive electronics 816 that is isolated from the input power source 810. Alternatively, the LVPS 814 may provide non-isolated power. The bidirectional LVPS 814 includes a first discrete power converter 822 and a second discrete power converter 824. The first discrete power converter 822 includes a first power stage 840 and first control electronics 820. The first control electronics 820 includes a first error amplifier 830 and a first pulse width modulator (PWM) 832. The first PWM 832 is used to convert the output voltage of the error amplifier 830 to duty cycle of the switch transistors in the power stage 840, and by doing so, enables the error amplifier 830 to control the output power of the converter power stage 840. The second power converter 824 includes a second power stage 870 and second control electronics 850. The second control electronics 850 includes a second error amplifier 860, a second pulse width modulator (PWM) 872, and an inverting amplifier 880. The PWM 872 is used to convert the output voltage of the inverting amplifier 860 to duty cycle of the switch transistors in the power stage 870, and by doing so, enables the error amplifier 860 to control the output power of the converter power stage 870. The bidirectional LVPS 814 is coupled to the input power source 810 to provide power to the motor drive electronics 816.

In FIG. 8, the second discrete converter 824 regulates using an added inverting amplifier 880 placed after the error amplifier 860. The second discrete converter 824 regulates the voltage to the motor drive electronics 816 to a voltage slightly greater than the designed output voltage of the first discrete converter 822.

The inverting amplifier 880 after the error amplifier 860 increases the duty cycle and output power of the second discrete converter 824 when the voltage to the motor drive electronics 816 increases, to sink additional power from the motor drive electronics 816, and deliver additional power to the input power source 810, which reduces the voltage to the motor drive electronics 816. Conversely, if the voltage to the motor drive electronics 816 decreases, the duty cycle and output power of the second discrete converter 824 is decreased to sink less power from the motor drive electronics 816, and deliver less power to the input power source 810, which allows the voltage to the motor drive electronics 816 to increase.

For example, the first discrete converter 822 may be set to regulate an output voltage of +15.0 V, and the second discrete converter 824 may be set to regulate an output voltage of +15.5 V. When the motor acts as a load, the first discrete converter 822 provides power to the motor drive electronics 816, and regulates the output voltage to +15.0 V. Since the LVPS output voltage is less than +15.5 V, the output voltage feedback to the second error amplifier 860 is low, the output of the second error amplifier 860 is high, and the output of the inverting amplifier 880 goes low, shutting off the second discrete power stage 870. When the motor sources power, the output voltage of the first discrete converter 822 rises to greater than 15.0 V, the output of the first error amplifier 830 drops low, and shuts off the transfer of power to the output through the first discrete converter 822. When the voltage to the motor drive electronics 816 reaches 15.5 V, the second error amplifier 860 goes low, the output of the inverting amplifier 880 goes high to turn on the second discrete power stage 870, which recycles power back to the input power source 810. The second discrete converter 824 regulates the voltage to the motor drive electronics 816 to +15.5 V by transferring power back to the input power source 810.

Figure 9:
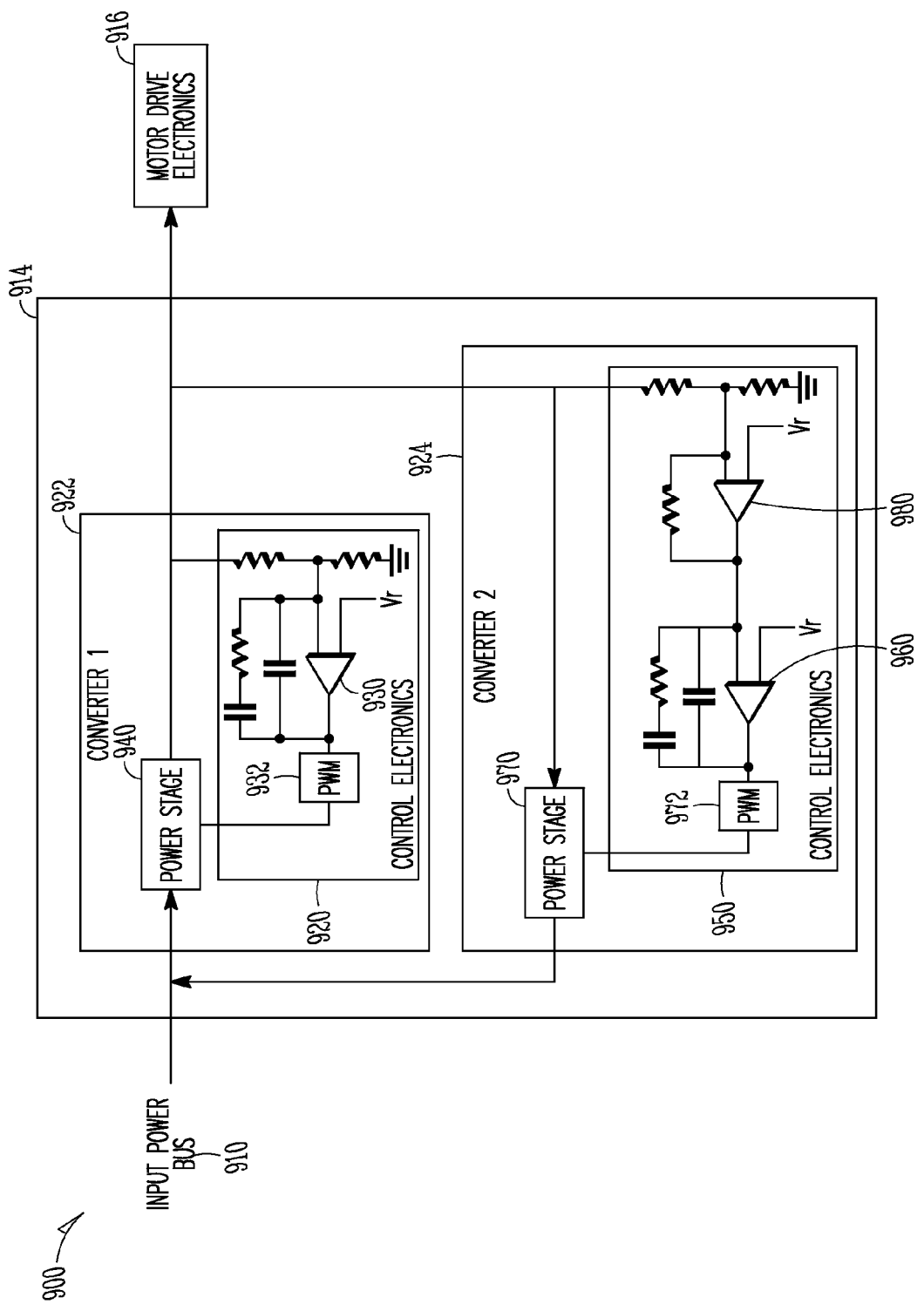
FIG. 9 is a detailed block diagram of another implementation (in which the inverter precedes the error amplifier) of a bidirectional low voltage power supply (LVPS) that uses two converters, according to an embodiment.

FIG. 9 is a block diagram of a motor drive system 900 that shows a simplified schematic diagram of a bidirectional low voltage power supply (LVPS) 814 that uses two converters according to another embodiment. A bidirectional LVPS 914 may provide power to the motor drive electronics 916 that is isolated from the input power source 910. Alternatively, the LVPS 914 may provide non-isolated power. The bidirectional LVPS 914 includes a first discrete power converter 922 and a second discrete power converter 924. The first discrete power converter 922 is coupled to input power source 910 and includes a first power stage 940 and first control electronics 920. The first control electronics 920 includes a first error amplifier 930 and a pulse width modulator (PWM) 932. The PWM 932 is used to convert the output voltage of the error amplifier 930 to duty cycle of the switch transistors in the power stage 940, and by doing so, enables the error amplifier 930 to control the output power of the converter power stage 940. The second power converter 924 includes a second power stage 970 and second control electronics 950. The second control electronics 950 includes a second error amplifier 960, a pulse width modulator (PWM) 972, and an inverting amplifier 980. The PWM 972 is used to convert the output voltage of the error amplifier 960 to duty cycle of the switch transistors in the power stage 970, and by doing so, enables the error amplifier 960 to control the output power of the converter power stage 970. The inverting amplifier 980 before the error amplifier 960 increases the duty cycle and output power of the second discrete converter 924 when the voltage to the motor drive electronics 916 increases, to sink additional power from the motor drive electronics 916, and deliver additional power to the input power source 910, which reduces the voltage to the motor drive electronics 916. Conversely, if the voltage to the motor drive electronics 916 decreases, the duty cycle and output power of the second discrete converter 924 is decreased to sink less power from the motor drive electronics 916, and deliver less power to the input power source 910, which allows the voltage to the motor drive electronics 916 to increase. The bidirectional LVPS 914 is coupled to the input power source 910 to provide power to the motor drive electronics 916.

Figure 10:
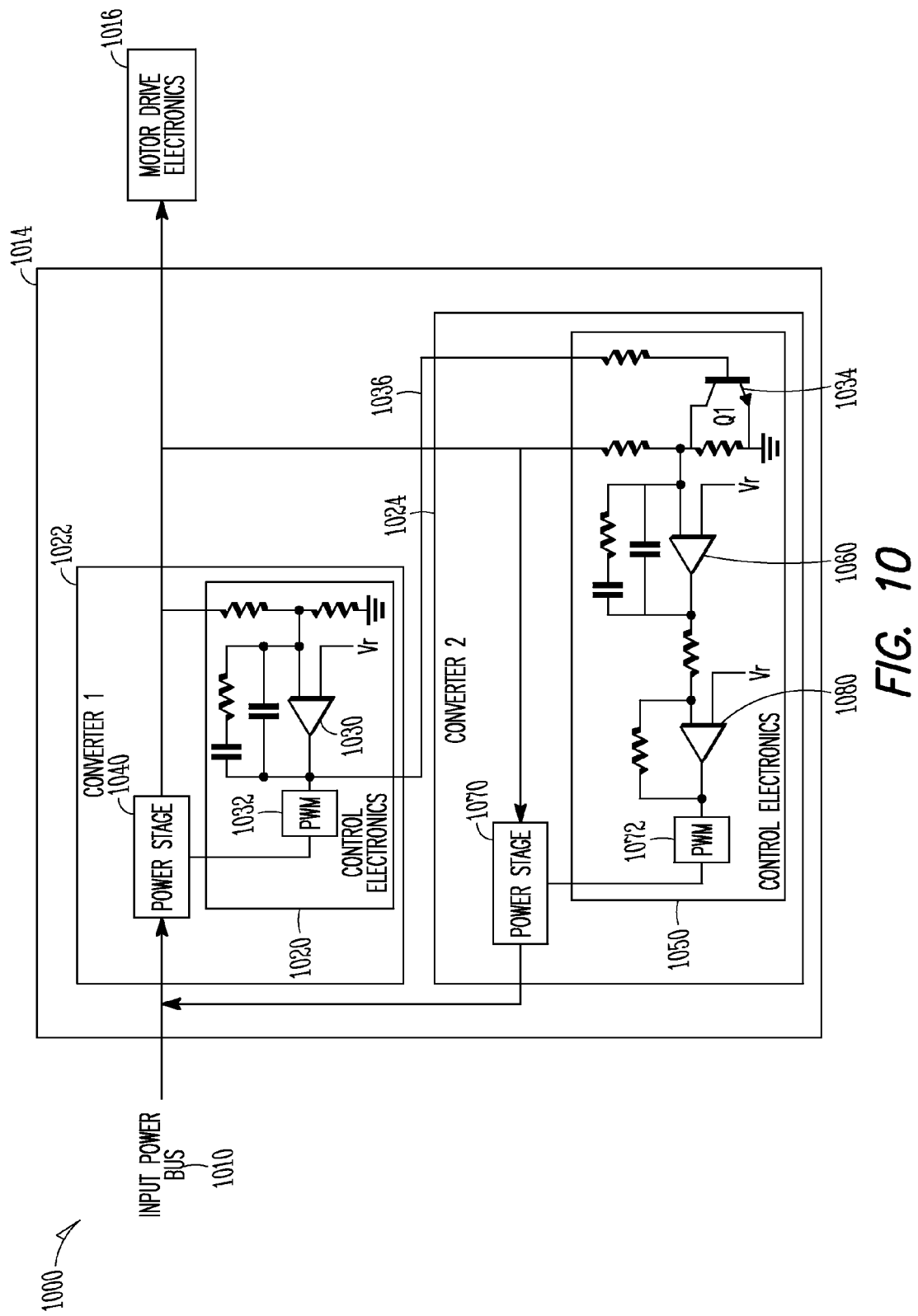
FIG. 10 is a detailed block diagram of one implementation of a bidirectional low voltage power supply (LVPS) that uses two converters, in which operation of the second converter is controlled by the error amplifier of the first converter, according to an embodiment.

FIG. 10 is a block diagram of a motor drive system 1000 that shows a simplified schematic diagram of a bidirectional low voltage power supply (LVPS) 1014 that uses two converters according to another embodiment. A bidirectional LVPS converter 1014 is coupled to the input power source 1010 to provide power to the motor drive electronics 1016.

The LVPS 1014 may provide power to the motor drive electronics 1016 that is isolated from the input power source 1010. Alternatively, the LVPS 1014 may provide non-isolated power. The bidirectional LVPS 1014 includes a first discrete power converter 1022 and a second discrete power converter 1024. The first discrete power converter 1022 includes a first power stage 1040 and first control electronics 1020. The first control electronics 1020 includes a first error amplifier 1030 and a pulse width modulator (PWM) 1032. The PWM 1032 is used to convert the output voltage of the error amplifier 1030 to duty cycle of the switch transistors in the power stage 1040, and by doing so, enables the error amplifier 1030 to control the output power of the converter power stage 1040. The second power converter 1024 includes a second power stage 1070 and second control electronics 1050. The second control electronics 1050 includes a second error amplifier 1060, a pulse width modulator (PWM) 1072, an inverting amplifier 1080, and a controlled switching device 1034. The PWM 1072 is used to convert the output voltage of the inverting amplifier 1060 to duty cycle of the switch transistors in the power stage 1070, and by doing so, enables the error amplifier 1060 to control the output power of the converter power stage 1070. The inverting amplifier 1080 after the error amplifier 1060 increases the duty cycle and output power of the second discrete converter 1024 when the voltage to the motor drive electronics 1016 increases, to sink additional power from the motor drive electronics 1016, and deliver additional power to the input power source 1010, which reduces the voltage to the motor drive electronics 1016. The bidirectional LVPS 1014 shown in FIG. 10 controls the operation of the second converter 1024 using a signal 1036 from the output of the error amplifier 1030 of the first converter 1022. The signal 1036 may be the direct output of the error amplifier 1030, or may be a signal generated from the output of the error amplifier 1030. The controlled switching device 1034 is shown as a bipolar transistor Q1, but any of many controlled switching devices (such as a MOSFET, comparator, optical coupler, operational amplifier, etc.) may be used.

In FIG. 10, transistor Q1, 1034, is added to the second control electronics 1050 to control the on/off state of the second discrete converter 1024 using a signal 1036 from the first error amplifier 1030 so that the second discrete converter 1024 is maintained in an off state until the output voltage of the first error amplifier 1030 of the first discrete converter 1022 goes low. When the motor is acting as a load, drawing power from the motor drive electronics 1016, the first discrete converter 1022 provides power to the motor drive electronics 1016, and the motor drive electronics 1016 drive the motor on the basis of motor drive current. The first error amplifier 1030 of the first discrete converter 1022 is at a high voltage level, the actual voltage level depends on the PWM used, the converter design, input bus voltage, and the power drawn by the motor drive electronics. Transistor Q1 1034 is turned on and holds the input to the second error amplifier 1060 low, which keeps the second discrete converter 1024 off.

When the motor is acting as a power source, sourcing power to the motor drive electronics 1016, the output voltage of the first discrete converter 1022 rises; the output voltage of the first error amplifier 1030 goes low, shuts off the transfer of power from the first discrete converter 1022 to the motor drive electronics 1016, and shuts off transistor Q1, 1034. With transistor Q1 1034 off, the feedback voltage to the second error amplifier 1060 goes high, the second error amplifier 1060 senses the high voltage, and the output voltage of the second error amplifier 1060 drops low. The output of the inverting amplifier 1080 goes high, and commands power to be recycled back to the input power source 1010. The second discrete converter 1024 regulates the voltage to the motor drive electronics 1016 by transferring power back to the input power source 1010. The second discrete converter 1024 may be capable of transferring more power than the motor is capable of sourcing, to maintain regulation of the voltage to the motor drive electronics 1016.

The addition of transistor Q1 1034 is one example of how to control the second discrete converter 1024 operation by the output voltage of the first error amplifier 1030. Alternatively, a comparator or other circuitry may be used to control the operation of the second discrete converter 1024 using the signal 1036 generated from the output voltage of the first error amplifier 1030 of the first discrete converter 1022. In addition, other means may be used to control the operation of the second discrete converter 1024 using a signal 1036 generated from the output voltage of the first error amplifier 1030 of the first discrete converter 1022. For example, some PWMs provide a shutdown pin to disable the PWM, shutting of the converter. On other PWMs, the error amplifier output may be pulled to ground to disable the PWM. However, those skilled in the art will recognize that embodiments are not meant to be limited in this respect. The idea to be understood is that the output voltage of the first error amplifier may be used to control whether the second converter is on or off. The converters may use fast recovery diodes, ultrafast recovery diodes, Schottky diodes, high voltage Schottky diodes, Silicon carbide (SiC) rectifiers, or synchronous rectification. Further, the converters may be hard-switched converters, soft-switched converters, or quasi-resonant converters. A converter may be or use a ripple regulator. Digital control may be used. Again, those skilled in the art will recognize that embodiments are not meant to be limited in this respect.

Figure 11:
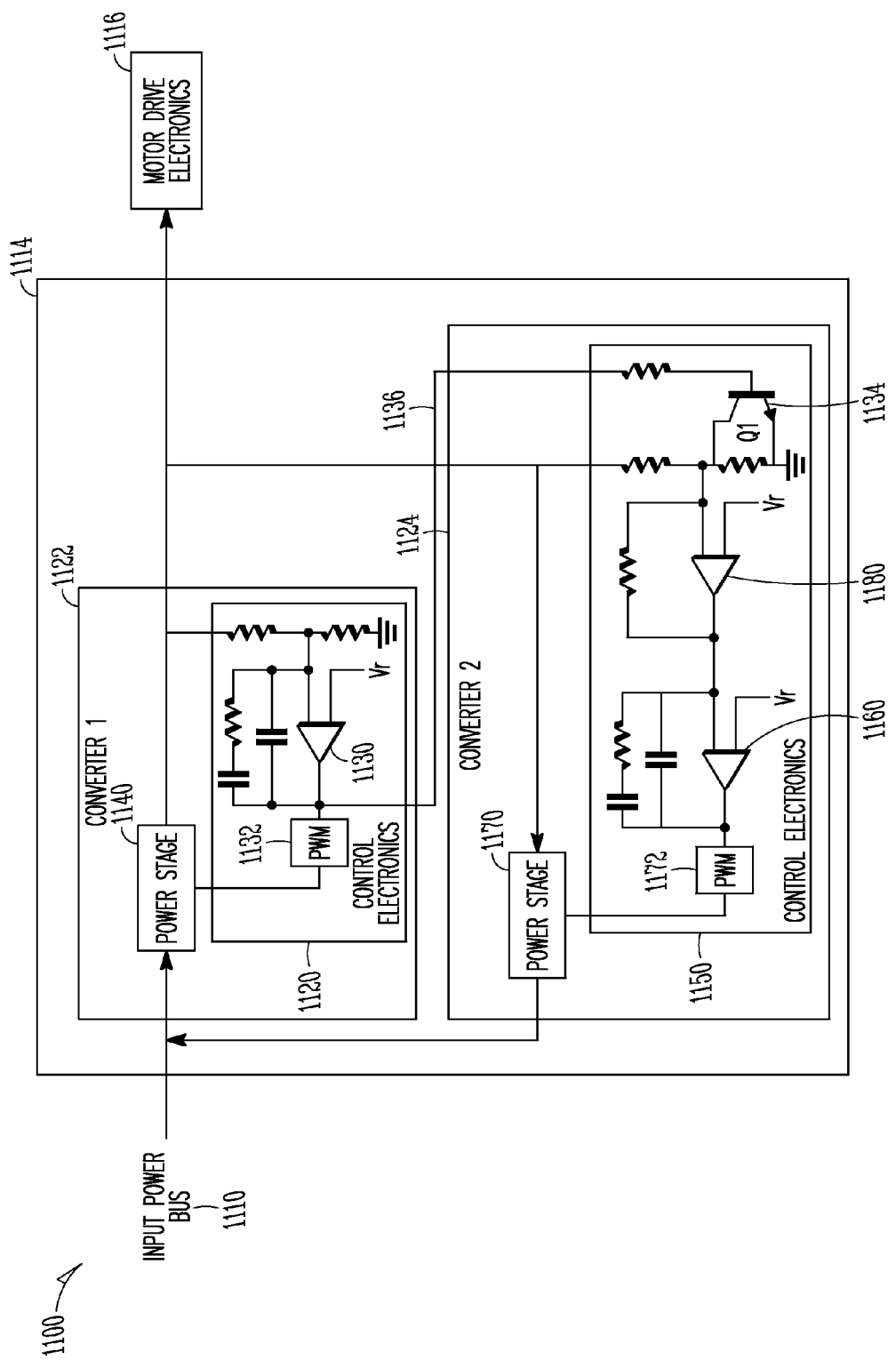
FIG. 11 is a detailed block diagram of another implementation of a bidirectional low voltage power supply (LVPS) that uses two converters, in which operation of the second converter is controlled by the error amplifier of the first converter, according to an embodiment.

FIG. 11 is a block diagram of a motor drive system 1100 that shows a simplified schematic diagram of a bidirectional low voltage power supply (LVPS) 1114 that uses two converters according to another embodiment. A bidirectional LVPS converter 1114 is coupled to the input power source 1110 to provide power to the motor drive electronics 1116. The LVPS 1114 may provide power to the motor drive electronics 1116 that is isolated from the input power source 1110. Alternatively, the LVPS 1114 may provide non-isolated power. The bidirectional LVPS 1114 includes a first discrete power converter 1122 and a second discrete power converter 1124. The first discrete power converter 1122 includes a first power stage 1140 and first control electronics 1120. The first control electronics 1120 includes a first error amplifier 1130 and a pulse width modulator (PWM) 1132. The PWM 1132 is used to convert the output voltage of the error amplifier 1130 to duty cycle of the switch transistors in the power stage 1140, and by doing so, enables the error amplifier 1130 to control the output power of the converter power stage 1140. The second power converter 1124 includes a second power stage 1170 and second control electronics 1150. The second control electronics 1150 includes a second error amplifier 1160, a pulse width modulator (PWM) 1172, an inverting amplifier 1180, and a controlled switching device Q1 1134. The PWM 1172 is used to convert the output voltage of the error amplifier 1160 to duty cycle of the switch transistors in the power stage 1170, and by doing so, enables the error amplifier 1160 to control the output power of the converter power stage 1170. The inverting amplifier 1180 before the error amplifier 1160 increases the duty cycle and output power of the second discrete converter 1124 when the voltage to the motor drive electronics 1116 increases, to sink additional power from the motor drive electronics 1116, and deliver additional power to the input power source 1110, which reduces the voltage to the motor drive electronics 1116. The bidirectional LVPS 1114 in FIG. 11 controls the operation of the second converter 1124 using the signal 1136 from the output of the error amplifier 1130 of the first converter 1122. The signal 1136 may be the direct output of the error amplifier 1130, or may be a signal generated from the output of the error amplifier 1130. The controlled switching device 1134 is shown as an NPN bipolar transistor Q1, but any of many controlled switching devices (such as a MOSFET, comparator, optical coupler, operational amplifier, etc.) may be used. In addition, other means may be used to control the operation of the second discrete converter 1124 using a signal 1136 generated from the output voltage of the first error amplifier 1130 of the first discrete converter 1122.

In FIG. 11, the second control electronics 1150 includes a transistor Q1 1134 to control the on/off state of the second discrete converter 1124 using a signal 1136 from the first error amplifier 1130 so that the second discrete converter 1124 is maintained in an off state until the output voltage of the first error amplifier 1130 of the first discrete converter 1122 goes low. When the motor is acting as a load, drawing power from the motor drive electronics 1116, the first discrete converter 1122 provides power to the motor drive electronics 1116, and the motor drive electronics 1116 drive the motor. The first error amplifier 1130 of the first discrete converter 1122 is at a high voltage level, the actual voltage level depends on the PWM used and the converter design, and the throughput power. Transistor Q1 1134 is turned on and holds the input to the inverting amplifier 1160 low, which keeps the second discrete converter 1124 off.

Figure 12:
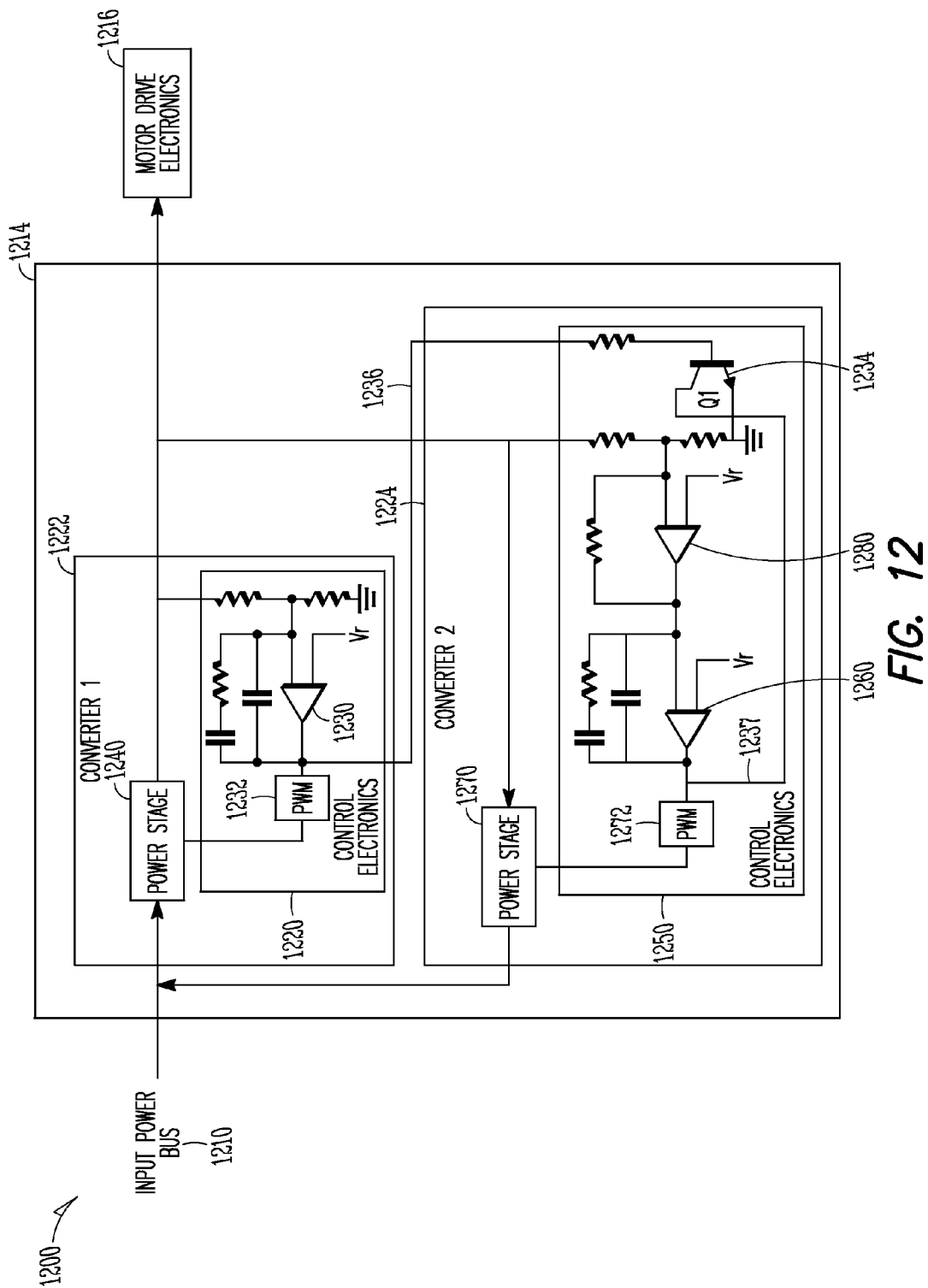
FIG. 12 is a detailed block diagram of another implementation of a bidirectional low voltage power supply (LVPS) that uses two converters, in which operation of the second converter is controlled by the error amplifier of the first converter, according to an embodiment.

FIG. 12 is a block diagram of a motor drive system 1200 that shows a simplified schematic diagram of a bidirectional low voltage power supply (LVPS) 1214 that uses two converters according to another embodiment, and illustrates another means to shut off the second converter 1224. The bidirectional LVPS converter 1214 is coupled to the input power source 1210 to provide power to the motor drive electronics 1216. The LVPS 1214 may provide power to the motor drive electronics 1216 that is isolated from the input power source 1210. Alternatively, the LVPS 1214 may provide non-isolated power. The bidirectional LVPS 1214 includes a first discrete power converter 1222 and a second discrete power converter 1224. The first discrete power converter 1222 includes a first power stage 1240 and first control electronics 1220. The first control electronics 1220 includes a first error amplifier 1230 and a pulse width modulator 1232. The PWM 1232 is used to convert the output voltage of the error amplifier 1230 to duty cycle of the switch transistors in the power stage 1240, and by doing so, enables the error amplifier 1230 to control the output power of the converter power stage 1240. The second power converter 1224 includes a second power stage 1270 and second control electronics 1250. The second control electronics 1250 includes a second error amplifier 1260, an inverting amplifier 1280, a pulse width modulator 1272, and a controlled switching device Q1 1234. The PWM device 1272 is used to convert the output voltage of the error amplifier 1260 to duty cycle of the switch transistors in the power stage 1270, and by doing so, enables the error amplifier 1260 to control the output power of the converter power stage 1270. The inverting amplifier 1280 before the error amplifier 1260 increases the duty cycle and output power of the second discrete converter 1224 when the voltage to the motor drive electronics 1216 increases, to sink additional power from the motor drive electronics 1216, and deliver additional power to the input power source 1212, which reduces the voltage to the motor drive electronics 1216. However, in FIG. 12, the transistor Q1 1234 used to control the on/off state of the second discrete converter 1224 using a signal 1236 from the first error amplifier 1230, or a signal generated from the output of the error amplifier 1230, coupled to the output of the error amplifier 1260 via signal 1237 to PWM 1272 to disable the second converter 1224.

Figure 13:
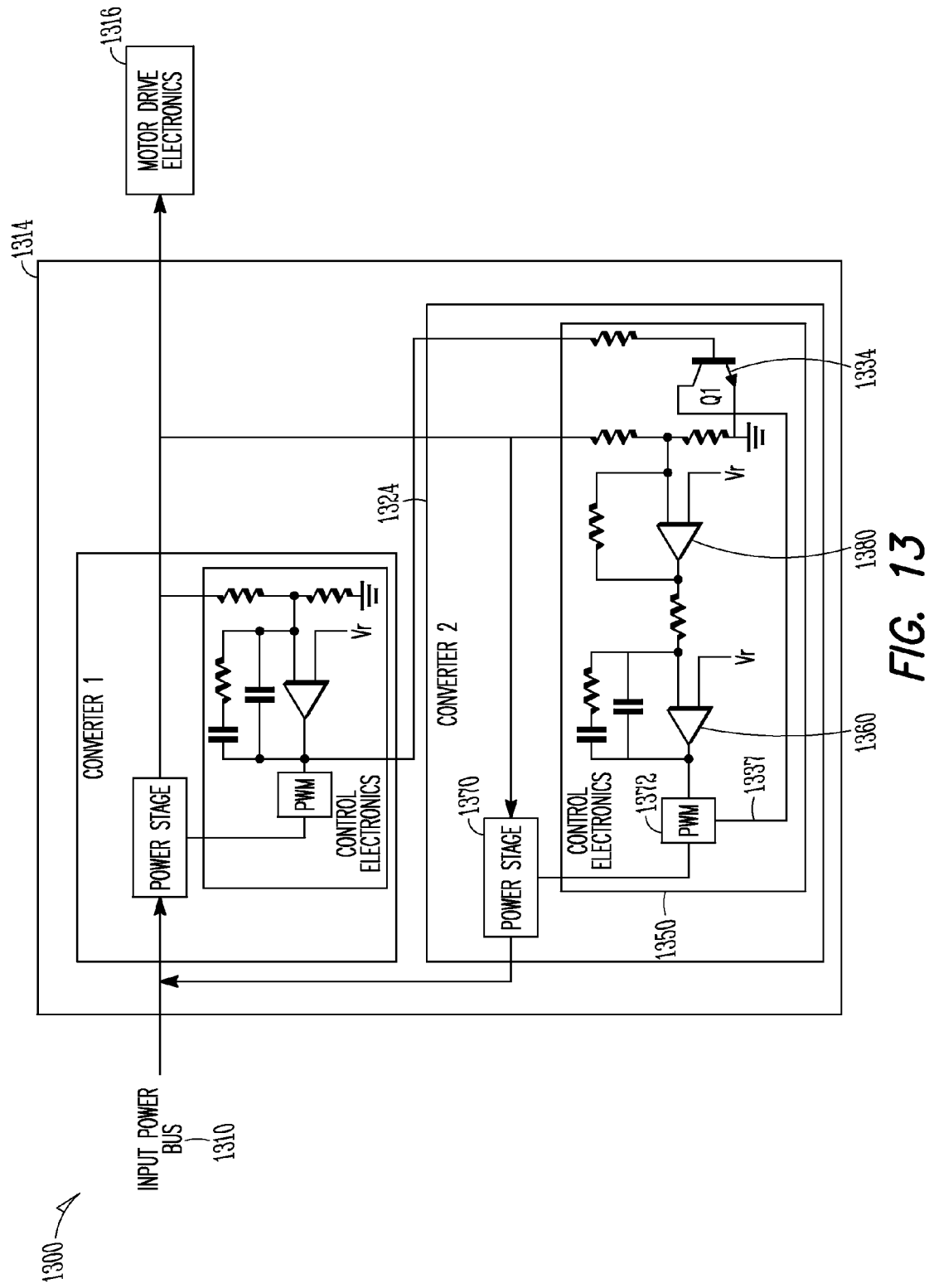
FIG. 13 is a simplified schematic diagram of an implementation of a bidirectional low voltage power supply (LVPS) that uses two converters, in which operation of the second converter is controlled by the error amplifier of the first converter, according to an embodiment.

FIG. 13 is a block diagram of a motor drive system 1300 that shows a simplified schematic diagram of a bidirectional low voltage power supply (LVPS) 1314 using two converters according to another embodiment. The bidirectional LVPS converter 1314 is coupled to the input power source 1310 to provide power to the motor drive electronics 1316. The second power converter 1324 includes a second power stage 1370 and second control electronics 1350. Thus, the bidirectional LVPS 1314 is similar to the bidirectional LVPS 1214 shown in FIG. 12, except the controlled switching device 1334 of the bidirectional LVPS 1314 provides a pull down 1337 at an input to the PWM 1372 to disable the second converter 1324.

Figure 14:
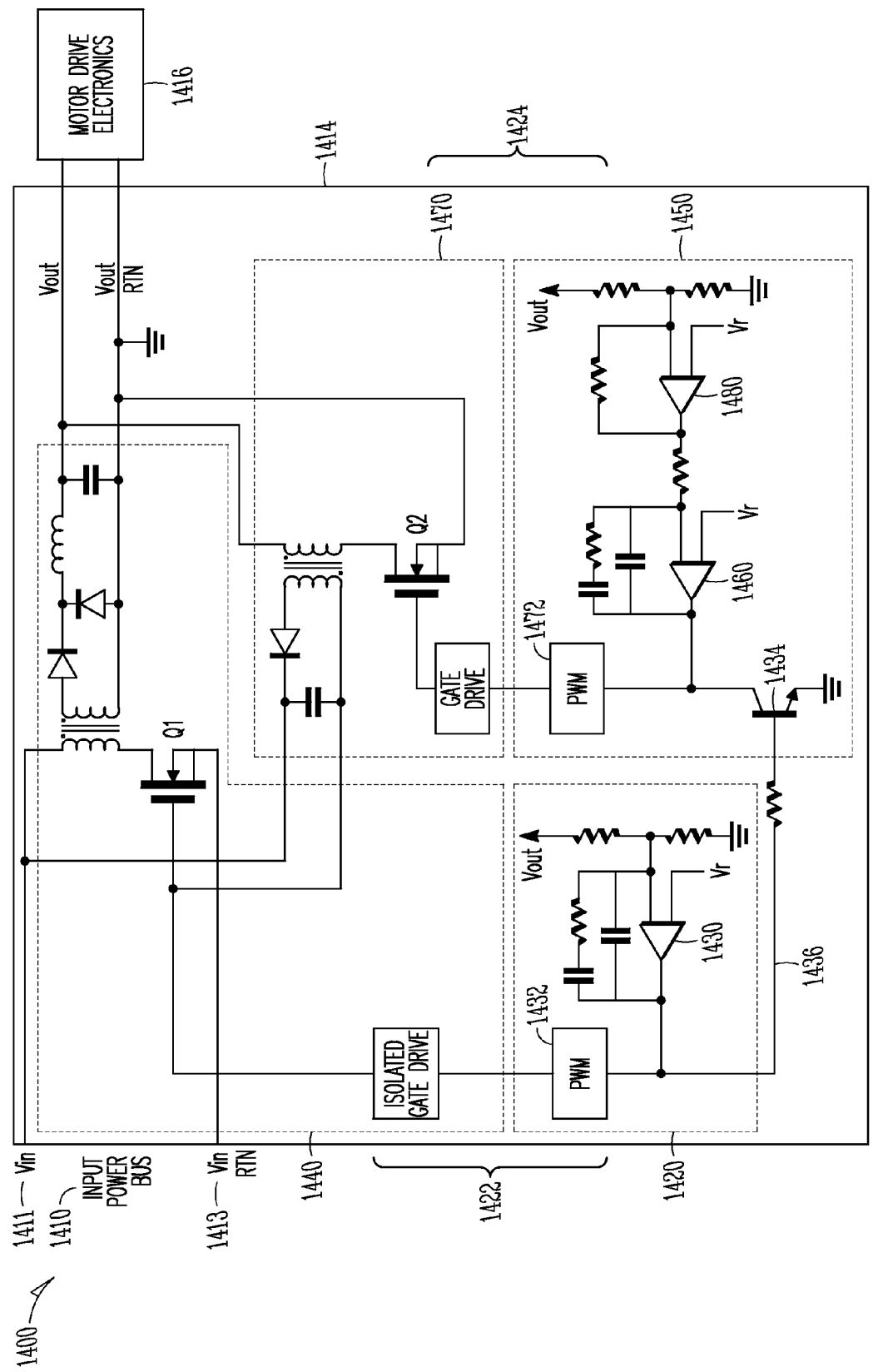
FIG. 14 is a simplified schematic diagram of a bidirectional LVPS according to an embodiment.

FIG. 14 is a block diagram of a motor drive system 1400 that shows a simplified schematic diagram of a bidirectional low voltage power supply 1414 according to an embodiment. The bidirectional LVPS 1414 is coupled to the input power source 1410 at Vin 1411 and Vin RTN (return) 1413 to provide power to the motor drive electronics 1416. The bidirectional LVPS 1414 provides power to the motor drive electronics that is isolated from the input power source. Alternatively, the LVPS 1414 may be configured to provide non-isolated power. The bidirectional LVPS 1414 includes a first discrete power converter 1422 and a second discrete power converter 1424. The first discrete power converter 1422 includes a first power stage 1440 and first control electronics 1420. The first control electronics 1420 includes a first error amplifier 1430 and a pulse width modulator (PWM) 1432. The PWM 1432 is used to convert the output voltage of the inverting amplifier 1430 to duty cycle of the switch transistors in the power stage 1440, and by doing so, enables the error amplifier 1430 to control the output power of the power stage 1440. The power stage 1440 is configured as a forward converter. The second power converter 1424 includes a second power stage 1470 and second control electronics 1450. The second control electronics 1450 includes a second error amplifier 1460, a pulse width modulator (PWM) 1472, and an inverting amplifier 1480. The PWM device 1472 is used to convert the output voltage of the inverting amplifier 1460 to duty cycle of the switch transistors in the power stage 1470, and by doing so, enables the error amplifier 1460 to control the output power of the power stage 1470. The inverting amplifier 1480 before the error amplifier 1460 increases the duty cycle and output power of the second discrete converter 1424 when the voltage to the motor drive electronics 1416 increases, to sink additional power from the motor drive electronics 1416, and deliver additional power to the input power source 1410, which reduces the voltage to the motor drive electronics 1416. The power stage 1470 is configured as a flyback converter. Signal 1436 from the first error amplifier 1430 is coupled to the output of the error amplifier 1460 through controlled switching device 1434 to control when the second power converter 1424 is enabled. However, it is to be noted that these converters are not limited to a forward converter and a flyback converter; these examples are given to be illustrative, and not restrictive.

Figure 15:
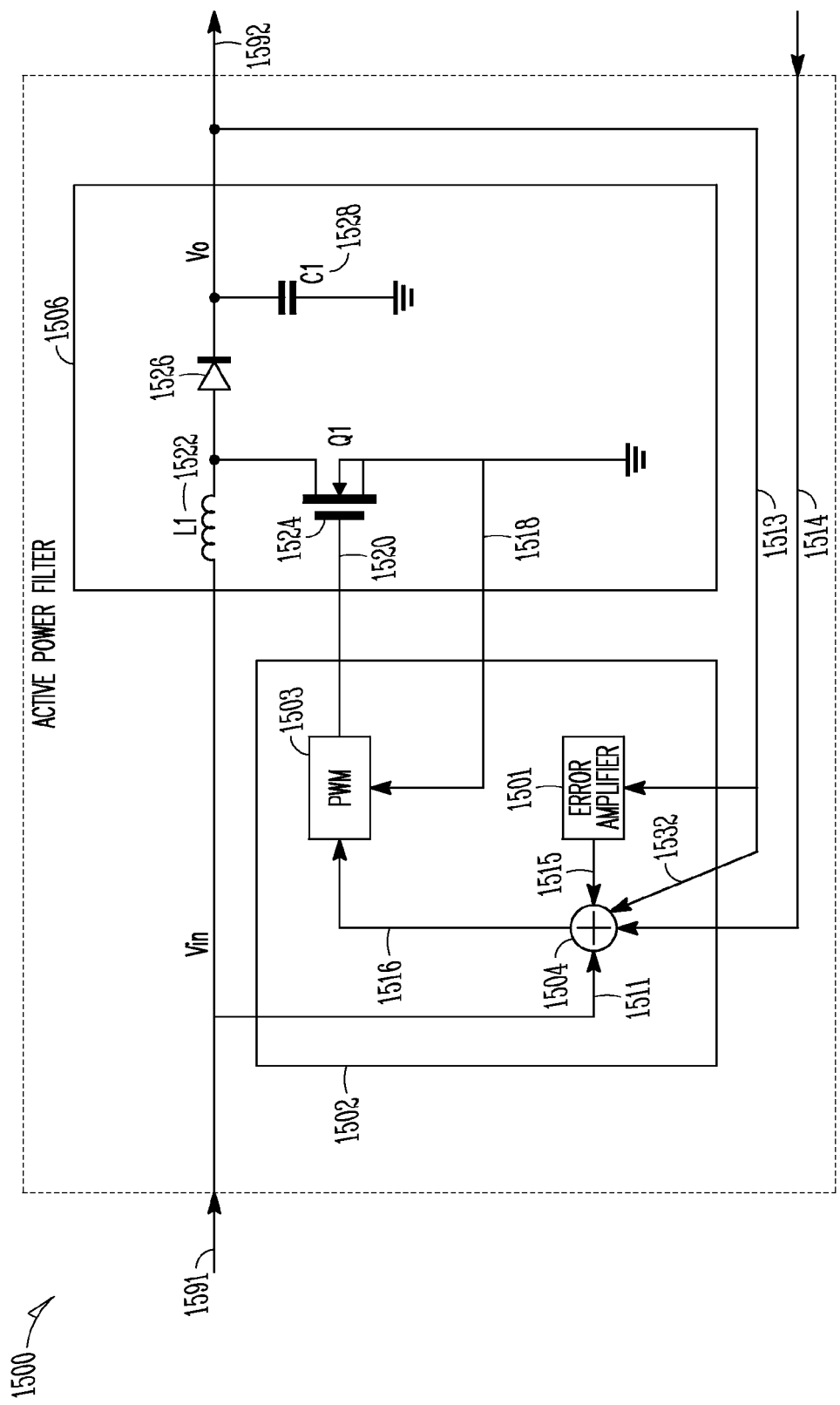
FIG. 15 is a functional block diagram of an active line filter in accordance with some embodiments.

FIG. 15 is a functional block diagram of an active line filter 1500 in accordance with some embodiments. Active line filter 1500 draws input current 1591 from a power source 1510 and provides output current 1592. In some embodiments, active line filter 1500 may achieve an input ripple current attenuation exceeding 30 dB. In embodiments, active line filter 1500 comprises control circuitry 1502 and power converter circuitry 1506.

Control circuitry 1502 may include error amplifier 1501, summing circuitry 1504, and pulse width modulator (PWM) 1503. Summing circuitry 1504 may combine error amplifier output voltage 1515, input voltage feed-forward signal 1511, output load feed-forward signal 1514 and output voltage feedforward 1532 to generate control signal 1516. Control signal 1516 may be compared to current sense signal 1518 to control the input current 1591 on a cycle-by-cycle basis, regulating the input current to a near DC level. This may provide significant attenuation of the input ripple current. Power converter circuitry 1506 may utilize either an isolated power converter, such as a flyback, forward, push pull, or full bridge power converter, or a non-isolated power converter, such as a boost, buck, buck boost, or tapped buck power converter, or multiple paralleled converters, such as interleaved converters, although the scope of the embodiments described herein are not limited in this respect. In some embodiments, active power filter 1500 may comprise one or more power converters 1506, and one or more control circuits 1502, although the scope of the embodiments described herein are not limited in this respect.

In FIG. 15, a continuous current boost power converter 1506 is shown as an illustrative example. In some embodiments, output rectifier element 1526 may comprise a diode, such as a silicon carbide (SiC) Schottky diode, or synchronous rectification, although the scope of the embodiments described herein are not limited in this respect. In some embodiments, inductive element 1522 may comprise one or more inductors, and/or charge storage element 1528 may comprise one or more capacitors, although the scope of the embodiments described herein are not limited in this respect. In some embodiments, switching element 1524 may comprise one or more switches or switching transistors, such as N-channel MOSFETs, although the scope of the embodiments described herein are not limited in this respect.

Current sense signal 1518 may be proportional to an amount of current drawn through switching element 1524, output voltage feedback signal 1513 may be proportional to the output voltage (Vo), input voltage feed-forward signal 1511 may be proportional to the input voltage (Vin), output load feed-forward signal 1514 may be proportional to the amount of power or current drawn by an output load subsystem, and output voltage feed-forward signal 1532 may be proportional to the output voltage (Vo). Although output voltage feed-forward signal 1532 and output voltage feedback signal 1513 are illustrated in FIG. 15 as being coupled together, embodiments may include additional circuitry may be implemented using distinct signals.

In some embodiments, active power filter 1500 may be a current mode control converter which regulates current through switching element 1524 on a cycle-by-cycle basis using current sense signal 1518 to tightly regulate input current 1591 to a DC level, thereby providing significant attenuation of the input ripple current. In these embodiments, active power filter 1500 may also regulate the output voltage (Vo) with a low or very low bandwidth output voltage regulation control loop to help ensure that the error amplifier output (e.g., signal 1515) does not modulate at frequencies to be attenuated.

In some embodiments in which active power filter 1500 includes a low or very low bandwidth control loop for helping to regulate the output voltage (Vo), a high bandwidth current sense signal may be used to tightly regulate input current 1591 using current mode control. In these embodiments, control circuitry 1502 may implement the control loops with an error amplifier that receives output voltage feedback signal 1513. Summing circuitry 1504 may combine error amplifier output voltage 1515 with input voltage feed-forward signal 1511, and output load feed-forward signal 1514 to generate control signal 1516. PWM 1503 may further implement the control loops by comparing control signal 1516 with current sense signal 1518 to create a control signal 1520 to control the current drawn by switching element 1524. However, any of several control schemes, such as peak current mode control, average current mode control, voltage mode control, or hysteretic mode control may be used, the scope of the embodiments described herein are not limited in this respect.

In some embodiments of active power filter 1500, weighting constants may be calculated to provide an optimum response to input voltage changes and output load changes. For example, the weighting constant for input voltage feed-forward signal 1511 may be calculated assuming that for a given output load, input current 1591 changes as a function of the input voltage. Assuming the use of current mode control for this example, control voltage 1516 may vary as a function of input voltage. Assuming further for calculation purposes that error amplifier output voltage 1515 does not change, and that output load feed-forward signal 1514 does not change, then input voltage feed-forward signal 1511 may be scaled to provide the correct variation in control voltage 1516.

A weighting constant for output load feed-forward signal 1514 may be calculated assuming that for a given input voltage, the input current changes as a function of the output load. Assuming again the use of current mode control, control voltage 1516 may vary as a function of output load current. Assuming further for calculation purposes that error amplifier output voltage 1515 does not change, and that input voltage feed-forward signal 1511 does not change, then output load feed-forward signal 1514 may then be scaled to provide correct variation in control voltage 1516. In some embodiments, a DC offset may be added to set the error amplifier output voltage 1515 in a predetermined voltage range.

In some embodiments of active power filter 1500, output voltage feed-forward signal 1532 may be provided to summing circuitry 1504. In such embodiments, any residual modulation of the input current due to output voltage ripple may be cancelled or reduced by an amount of offset modulation produced by the combining of output voltage feed-forward signal 1532 with error amplifier output voltage 1515, input voltage feed-forward signal 1511 and output load feed-forward signal 1514. Output voltage feed-forward signal 1532 may then be scaled to provide attenuation of input ripple current.

As can be seen from examination of active power filter 1500, when input current 1591 is a regulated DC input current, the average current in output rectifier element 1526 is also controlled to a fixed level proportional to the input current 1591 and the operating duty cycle. Also, for a fixed regulated average current in output rectifier element 1526 and output current 1592 having significant ripple current, the difference between the current in output rectifier element 1526 and output load current 1592 is provided by charge storage element 1528, depending on the relative levels between the two currents. Output voltage ripple may therefore be a function of the output load ripple current and the output capacitance. In some embodiments, charge storage element 1528 may provide an amount of output capacitance to maintain a sufficiently low amount of output ripple voltage. However, in many if not most cases, the amount of output capacitance used to maintain a sufficiently low amount of output ripple voltage may be prohibitively large and contain a prohibitive amount of mass. In some embodiments, to help minimize output capacitance (e.g., in both volume and mass) this output ripple voltage may be allowed to be a significant fraction of the DC output voltage, especially given the relative ease by which the electronics can be designed to operate with a significant amount of input ripple voltage, although the scope of the embodiments described herein are not limited in this respect.

In some embodiments, the active line filters disclosed in U.S. Pat. Nos. 7,038,435, 7,019,503, and 7,141,940 may be used as the active line filter of the integrated motor drive power electronics system disclosed herein. In some embodiments, the bidirectional motor driver LVPS of U.S. patent application Ser. No. 13/855,298 may be used as the LVPS of the integrated motor drive power electronics system disclosed herein.

Some embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An integrated motor drive power electronics system, comprising:
   an active line filter configured to:
      control and regulate time-invariant current drawn from a direct-current input power source, and
      attenuate current ripple fed back to the input power source;
   higher power motor drive electronics configured to operate directly from an output of the active line filter;
   a bidirectional low voltage power supply configured to:
      provide regulated power to a motor,
      regulate voltage at the motor to a predetermined output voltage, and
      selectively recycle power from the motor back to the input power source;
   lower power motor driver electronics configured to operate from an output of the bidirectional low voltage power supply; and an energy storage capacitance coupled to the output of the active line filter and configured to serve as a local input power source for the higher power motor drive electronics and the bidirectional low voltage power supply, wherein the bidirectional low voltage power supply comprises:
a first discrete power converter configured to provide regulated power to the motor; and
a second discrete power converter configured to selectively recycle power from an output of the first discrete power converter back to the input power source and regulate the voltage at the motor to the predetermined output voltage, and wherein the energy storage capacitance is recharged by a difference between current supplied by the active line filter and load current drawn by the higher power motor drive electronics plus load current drawn by the bidirectional low voltage power supply.

2. The integrated motor drive power electronics system of claim 1, wherein:
the bidirectional low voltage power supply includes a first power stage to provide power conversion and first control electronics including a first error amplifier for controlling the first power stage to regulate a voltage at the output of the first discrete power converter to a first predetermined output voltage,
the second discrete power converter is coupled in parallel and in an opposite orientation with the first discrete power converter and includes a second power stage and second control electronics, the second power stage configured to provide power conversion to recycle the output power back to the input power source, and
the second control electronics include a second error amplifier for controlling the second power stage and configured to regulate the voltage at the output of the bidirectional low voltage power supply to a second predetermined output voltage.

3. The integrated motor drive power electronics system of claim 2, wherein the first error amplifier is configured to:
reduce an output voltage of the first error amplifier when a voltage at the output of the first discrete power converter exceeds the first predetermined output voltage, and
further reduce the output voltage of the first error amplifier and set a duty cycle of the first discrete power converter to zero to disable the first discrete power converter when the output voltage remains higher than the first predetermined output voltage.

4. The integrated motor drive power electronic s system of claim 3, wherein when the second error amplifier detects that the voltage at the output of the bidirectional low voltage power supply exceeds the second predetermined output voltage, the second error amplifier is configured to increase an output voltage of the second error amplifier to enable the second discrete power converter to recycle power back to the input power source.

5. The integrated motor drive power electronics system of claim 1, wherein the second discrete power converter is configured to recycle power from the output of the first discrete power converter to the input of the first discrete power converter until a voltage at the output of the first discrete power converter drops below a predetermined output voltage.

6. A method for providing power in an integrated motor drive power electronics system, the method comprising:

controlling time-invariant current drawn from a direct-current input power source with an active line filter;
attenuating current ripple fed back to the input power source;
operating higher power motor drive electronics directly from an output of the active line filter;
providing regulated power to a motor with a bidirectional low voltage power supply;
selectively recycling power from the motor back to the input power source;
regulating a voltage at the motor to a predetermined output voltage;
operating lower power motor driver electronics from an output of the bidirectional low voltage power supply; and
providing a local input power source for the higher power motor drive electronics and the bidirectional low voltage power supply.

7. The method of claim 6 further comprising:
detecting when a voltage at the output of the bidirectional low voltage power supply exceeds the predetermined output voltage;
recycling power back to the input power source; and
regulating the voltage at the output of the bidirectional low voltage power supply.

8. An integrated motor drive power electronics system, comprising:
expander and balancer drive electronics configured to drive an expander motor and a balancer motor;
an active line filter arranged to:
attenuate ripple current fed back to a direct-current input power source, and
attenuate input voltage transients;
compressor motor drive electronics arranged to:
drive one or more compressor motors, and
draw power from and return power to an output of the active line filter; and
a bidirectional low voltage power supply arranged to:
provide power to the expander and balancer drive electronics,
recycle power from at least one of the expander motor and the balancer motor back to the output of the active line filter,
reduce electro-magnetic interference from the output of the active line filter, and
reduce input ripple current on the input power source.

9. The integrated motor drive power electronics system of claim 8 wherein the compressor motor drive electronics are arranged to drive one or more compressor motors of a cryocooler.

10. The integrated motor drive power electronics system of claim 9, further comprising an energy storage capacitance coupled to the output of the active line filter and configured to serve as a local input power source for the compressor motor drive electronics and the bidirectional low voltage power supply.

11. The integrated motor drive power electronics system of claim 10 wherein:
compressor motor drive currents and voltage transients reflected back to the input power source are reduced, and
power sourced from a cryocooler motor is recycled back to the energy storage capacitance to increase efficiency.

* * * * *

UNITED STATES PATENT AND TRADEMARK OFFICE
CERTIFICATE OF CORRECTION

PATENT NO. : 9,716,447 B2  
APPLICATION NO. : 14/307728  
DATED : July 25, 2017  
INVENTOR(S) : Joe Anthony Ortiz Page 1 of 1

It is certified that error appears in the above-identified patent and that said Letters Patent is hereby corrected as shown below:

In the Specification

In Column 7, Line 4, delete "132" and insert --232-- therefor

In the Claims

In Column 21, Line 49, in Claim 4, delete "electronic s" and insert --electronics-- therefor Signed and Sealed this
Twenty-eighth Day of April, 2020

Andrei Iancu
*Director of the United States Patent and Trademark Office*